United States Patent
Dorneanu et al.

(10) Patent No.: US 10,594,153 B2
(45) Date of Patent: *Mar. 17, 2020

(54) FREQUENCY RESPONSE OPTIMIZATION CONTROL SYSTEM

(71) Applicant: Con Edison Battery Storage, LLC, Valhalla, NY (US)

(72) Inventors: Radu Dorneanu, Greendale, WI (US); Michael J. Wenzel, Oak Creek, WI (US); Mohammad N. Elbsat, Milwaukee, WI (US); Kirk H. Drees, Cedarburg, WI (US)

(73) Assignee: Con Edison Battery Storage, LLC, Valhalla, NY (US)

( * ) Notice: Subject to any disclaimer, the term of this patent is extended or adjusted under 35 U.S.C. 154(b) by 189 days.

This patent is subject to a terminal disclaimer.

(21) Appl. No.: 15/663,384

(22) Filed: Jul. 28, 2017

(65) Prior Publication Data

US 2018/0034286 A1 Feb. 1, 2018

Related U.S. Application Data

(60) Provisional application No. 62/368,878, filed on Jul. 29, 2016.

(51) Int. Cl.
*H02J 7/00* (2006.01)
*H01M 10/48* (2006.01)
(Continued)

(52) U.S. Cl.
CPC ............ *H02J 7/007* (2013.01); *G01R 31/382* (2019.01); *G05B 15/02* (2013.01); *G06Q 50/06* (2013.01);
(Continued)

(58) Field of Classification Search
CPC ................................ H02J 7/007; H02J 7/0063
(Continued)

(56) References Cited

U.S. PATENT DOCUMENTS

| | | |
|---|---|---|
| 4,349,869 A | 9/1982 | Prett et al. |
| 4,616,308 A | 10/1986 | Morshedi et al. |

(Continued)

FOREIGN PATENT DOCUMENTS

| | | |
|---|---|---|
| CN | 102891495 | 1/2016 |
| EP | 2 506 380 | 10/2012 |

(Continued)

OTHER PUBLICATIONS

U.S. Appl. No. 13/802,154, filed Mar. 13, 2013, Johnson Controls Technology Company.

(Continued)

*Primary Examiner* — Richard V Muralidar
(74) *Attorney, Agent, or Firm* — Michael Best & Friedrich LLP

(57) ABSTRACT

A frequency response optimization system includes a battery configured to store and discharge electric power, a power inverter configured to control an amount of the electric power stored or discharged from the battery, a high level controller, and a low level controller. The high level controller is configured to receive a regulation signal from an incentive provider, determine statistics of the regulation signal, and use the statistics of the regulation signal to generate an optimal frequency response midpoint. The optimal midpoint achieves a desired change in the state-of-charge of the battery while participating in a frequency response program. The low level controller is configured to use the midpoints to determine optimal battery power setpoints for the power inverter. The power inverter is configured to use the optimal battery power setpoints to control an (Continued)

amount of the electric power stored or discharged from the battery.

20 Claims, 5 Drawing Sheets

(51) Int. Cl.
    *G05B 15/02*     (2006.01)
    *G01R 31/382*     (2019.01)
    *G06Q 50/06*     (2012.01)
    *H02J 7/34*     (2006.01)
    *H02J 3/38*     (2006.01)
    *H02J 3/32*     (2006.01)

(52) U.S. Cl.
    CPC ............ *H01M 10/486* (2013.01); *H02J 3/32* (2013.01); *H02J 3/381* (2013.01); *H02J 7/0063* (2013.01); *H02J 7/34* (2013.01); *H02J 2007/0067* (2013.01)

(58) Field of Classification Search
    USPC .................... 320/134; 307/46, 66, 67, 77
    See application file for complete search history.

(56) References Cited

U.S. PATENT DOCUMENTS

| | | |
|---|---|---|
| 5,301,101 A | 4/1994 | MacArthur et al. |
| 5,347,446 A | 9/1994 | Iino et al. |
| 5,351,184 A | 9/1994 | Lu et al. |
| 5,408,406 A | 4/1995 | Mathur et al. |
| 5,442,544 A | 8/1995 | Jelinek |
| 5,519,605 A | 5/1996 | Cawlfield |
| 5,572,420 A | 11/1996 | Lu |
| 6,055,483 A | 4/2000 | Lu |
| 6,122,555 A | 9/2000 | Lu |
| 6,278,899 B1 | 8/2001 | Piche et al. |
| 6,347,254 B1 | 2/2002 | Lu |
| 6,459,939 B1 | 10/2002 | Hugo |
| 6,757,591 B2 | 6/2004 | Kramer |
| 6,807,510 B1 | 10/2004 | Backstrom et al. |
| 7,050,863 B2 | 5/2006 | Mehta et al. |
| 7,050,866 B2 | 5/2006 | Martin et al. |
| 7,113,890 B2 | 9/2006 | Frerichs et al. |
| 7,152,023 B2 | 12/2006 | Das |
| 7,165,399 B2 | 1/2007 | Stewart |
| 7,188,779 B2 | 3/2007 | Alles |
| 7,197,485 B2 | 3/2007 | Fuller |
| 7,203,554 B2 | 4/2007 | Fuller |
| 7,266,416 B2 | 9/2007 | Gallestey et al. |
| 7,272,454 B2 | 9/2007 | Wojsznis et al. |
| 7,275,374 B2 | 10/2007 | Stewart et al. |
| 7,328,074 B2 | 2/2008 | Das et al. |
| 7,328,577 B2 | 2/2008 | Stewart et al. |
| 7,376,471 B2 | 5/2008 | Das et al. |
| 7,376,472 B2 | 5/2008 | Wojsznis et al. |
| 7,389,773 B2 | 6/2008 | Stewart et al. |
| 7,400,933 B2 | 7/2008 | Rawlings et al. |
| 7,418,372 B2 | 8/2008 | Nishira et al. |
| 7,454,253 B2 | 11/2008 | Fan |
| 7,496,413 B2 | 2/2009 | Fan et al. |
| 7,577,483 B2 | 8/2009 | Fan et al. |
| 7,591,135 B2 | 9/2009 | Stewart |
| 7,610,108 B2 | 10/2009 | Boe et al. |
| 7,650,195 B2 | 1/2010 | Fan et al. |
| 7,664,573 B2 | 2/2010 | Ahmed |
| 7,676,283 B2 | 3/2010 | Liepold et al. |
| 7,826,909 B2 | 11/2010 | Attarwala |
| 7,827,813 B2 | 11/2010 | Seem |
| 7,839,027 B2 | 11/2010 | Shelton et al. |
| 7,844,352 B2 | 11/2010 | Vouzis et al. |
| 7,856,281 B2 | 12/2010 | Thiele et al. |
| 7,878,178 B2 | 2/2011 | Stewart et al. |
| 7,894,943 B2 | 2/2011 | Sloup et al. |
| 7,930,045 B2 | 4/2011 | Cheng |
| 7,945,352 B2 | 5/2011 | Koc |
| 7,949,416 B2 | 5/2011 | Fuller |
| 7,987,145 B2 | 7/2011 | Baramov |
| 7,996,140 B2 | 8/2011 | Stewart et al. |
| 8,005,575 B2 | 8/2011 | Kirchhof |
| 8,032,235 B2 | 10/2011 | Sayyar-Rodsari |
| 8,036,758 B2 | 10/2011 | Lu et al. |
| 8,046,089 B2 | 10/2011 | Renfro et al. |
| 8,060,258 B2 | 11/2011 | Butoyi |
| 8,060,290 B2 | 11/2011 | Stewart et al. |
| 8,073,659 B2 | 12/2011 | Gugaliya et al. |
| 8,078,291 B2 | 12/2011 | Pekar et al. |
| 8,096,140 B2 | 1/2012 | Seem |
| 8,105,029 B2 | 1/2012 | Egedal et al. |
| 8,109,255 B2 | 2/2012 | Stewart et al. |
| 8,121,818 B2 | 2/2012 | Gorinevsky |
| 8,126,575 B2 | 2/2012 | Attarwala |
| 8,145,329 B2 | 3/2012 | Pekar et al. |
| 8,180,493 B1 | 5/2012 | Laskow |
| 8,185,217 B2 | 5/2012 | Thiele |
| 8,200,346 B2 | 6/2012 | Thiele |
| 8,295,989 B2 | 10/2012 | Rettger et al. |
| 8,492,926 B2 | 7/2013 | Collins et al. |
| 8,495,888 B2 | 7/2013 | Seem |
| 8,600,561 B1 | 12/2013 | Modi et al. |
| 8,600,571 B2 | 12/2013 | Dillon et al. |
| 8,843,238 B2 | 9/2014 | Wenzel et al. |
| 8,901,411 B2 | 12/2014 | Liu et al. |
| 8,914,158 B2 | 12/2014 | Geinzer et al. |
| 8,922,056 B2 | 12/2014 | Thisted |
| 9,002,532 B2 | 4/2015 | Asmus |
| 9,002,761 B2 | 4/2015 | Montalvo |
| 9,235,657 B1 | 1/2016 | Wenzel et al. |
| 9,436,179 B1 | 9/2016 | Turney et al. |
| 2005/0062289 A1 | 3/2005 | Cho et al. |
| 2009/0313083 A1 | 12/2009 | Dillon et al. |
| 2009/0319090 A1 | 12/2009 | Dillon et al. |
| 2010/0087933 A1 | 4/2010 | Cheng |
| 2010/0198420 A1 | 8/2010 | Rettger et al. |
| 2010/0235004 A1 | 9/2010 | Thind |
| 2010/0269854 A1 | 10/2010 | Barbieri et al. |
| 2011/0022193 A1 | 1/2011 | Panaitescu |
| 2011/0060424 A1 | 3/2011 | Havlena |
| 2011/0066258 A1 | 3/2011 | Torzhkov et al. |
| 2011/0088000 A1 | 4/2011 | Mackay |
| 2011/0125293 A1 | 5/2011 | Havlena |
| 2011/0190958 A1 | 8/2011 | Hirst |
| 2011/0221276 A1 | 9/2011 | Geinzer et al. |
| 2011/0257789 A1 | 10/2011 | Stewart et al. |
| 2011/0276269 A1 | 11/2011 | Hummel |
| 2011/0301723 A1 | 12/2011 | Pekar et al. |
| 2012/0010757 A1 | 1/2012 | Francino et al. |
| 2012/0059351 A1 | 3/2012 | Nordh |
| 2012/0060505 A1 | 3/2012 | Fuller et al. |
| 2012/0083930 A1 | 4/2012 | Ilic et al. |
| 2012/0109620 A1 | 5/2012 | Gaikwad et al. |
| 2012/0116546 A1 | 5/2012 | Sayyar-Rodsari |
| 2012/0130555 A1 | 5/2012 | Jelinek |
| 2012/0232701 A1 | 9/2012 | Carty et al. |
| 2012/0261990 A1 | 10/2012 | Collins et al. |
| 2012/0323396 A1 | 12/2012 | Shelton et al. |
| 2012/0326511 A1 | 12/2012 | Johnson |
| 2013/0138285 A1 | 5/2013 | Bozchalui et al. |
| 2013/0184884 A1 | 7/2013 | More et al. |
| 2013/0300194 A1 | 11/2013 | Palmer et al. |
| 2013/0345880 A1 | 12/2013 | Asmus |
| 2014/0037909 A1 | 2/2014 | Hawwa et al. |
| 2014/0049109 A1 | 2/2014 | Kearns et al. |
| 2014/0052308 A1 | 2/2014 | Hanafusa |
| 2014/0239722 A1 | 8/2014 | Arai et al. |
| 2014/0336840 A1 | 11/2014 | Geinzer et al. |
| 2014/0354239 A1 | 12/2014 | Miyazaki et al. |
| 2014/0358316 A1 | 12/2014 | Shichiri |
| 2015/0008884 A1* | 1/2015 | Waki ................. H02J 3/32 320/134 |
| 2015/0019034 A1 | 1/2015 | Gonatas |
| 2015/0021991 A1 | 1/2015 | Wood et al. |
| 2015/0045962 A1 | 2/2015 | Wenzel et al. |

(56) References Cited

U.S. PATENT DOCUMENTS

| | | | |
|---|---|---|---|
| 2015/0046221 A1 | 2/2015 | Narayan et al. | |
| 2015/0084339 A1 | 3/2015 | McDaniel et al. | |
| 2015/0088315 A1 | 3/2015 | Behrangrad | |
| 2015/0277467 A1 | 10/2015 | Steven et al. | |
| 2016/0028234 A1 | 1/2016 | Watanabe et al. | |
| 2018/0054061 A1* | 2/2018 | Dorneanu | H02J 3/38 |

FOREIGN PATENT DOCUMENTS

| | | |
|---|---|---|
| EP | 2 549 617 | 1/2013 |
| EP | 2 660 943 | 11/2013 |
| EP | 2 773 008 | 9/2014 |
| EP | 2 871 742 | 5/2015 |
| JP | 2014-233096 | 12/2014 |
| WO | WO 02/15365 | 2/2002 |
| WO | WO 2010/042550 | 4/2010 |
| WO | WO 2010/057250 | 5/2010 |
| WO | WO 2010/094012 | 8/2010 |
| WO | WO 2011/080548 | 7/2011 |
| WO | WO 2012/122234 | 9/2012 |
| WO | WO 2013/063581 | 5/2013 |
| WO | WO 2014/016727 | 1/2014 |
| WO | WO 2015/019541 | 2/2015 |
| WO | WO 2015/139061 | 9/2015 |

OTHER PUBLICATIONS

Hoke et al., Active Power Control of Photovoltaic Power Systems, 2013 1st IEEE Conference on Technologies for Sustainability (SusTech), Aug. 1-2, 2013, 8 pages.

Lopez-Martinez et al., Vision-Based System for the Safe Operation of a Solar Power Tower Plant, in Advances in Artificial Intelligence—IBERAMIA 2002, 8th Ibero-American Conference on Artificial Intelligence, Nov. 2002, Springer Berlin Heidelberg, 10 pages.

Sasikala et al., Coordinated Control and Strategy of Solar Photovoltaic Generators with MPPT and Battery Storage in Micro Grids, International Journal of Scientific Engineering and Technology Research, vol. 3, No. 46, Dec. 2014, 7 pages.

SMA Solar Technology AG, PV and Storage: Solutions with Potential-Energy on demand with the Sunny Central Storage, Brochure, Nov. 30, 2002, 8 pages.

Search Report and Written Opinion for International Application No. PCT/US2016/056165, dated Jan. 3, 2017, 13 pages.

Search Report and Written Opinion for International Application No. PCT/US2016/056167, dated Jan. 3, 2017, 12 pages.

Search Report and Written Opinion for International Application No. PCT/US2016/056169, dated Jan. 3, 2017, 12 pages.

Search Report and Written Opinion for International Application No. PCT/US2016/056170, dated Jan. 18, 2017, 12 pages.

Search Report and Written Opinion for International Application No. PCT/US2016/056179, dated Jan. 19, 2017, 10 pages.

Search Report and Written Opinion for International Application No. PCT/US2016/056182, dated Jan. 4, 2017, 13 pages.

Search Report and Written Opinion for International Application No. PCT/US2016/056183, dated Dec. 20, 2016, 13 pages.

Search Report and Written Opinion for International Application No. PCT/US2016/056184, dated Dec. 20, 2016, 13 pages.

Search Report and Written Opinion for International Application No. PCT/US2016/056186, dated Jan. 16, 2017, 10 pages.

Search Report and Written Opinion for International Application No. PCT/US2016/056187, dated Dec. 9, 2016, 12 pages.

Search Report and Written Opinion for International Application No. PCT/US2016/056189, dated Dec. 21, 2016, 11 pages.

Search Report and Written Opinion for International Application No. PCT/US2016/056190, dated Jan. 18, 2017, 10 pages.

Search Report and Written Opinion for International Application No. PCT/US2016/056192, dated Jan. 16, 2017, 11 pages.

Search Report for International Application No. PCT/US2016/056178, dated Jan. 25, 2017, 3 pages.

Search Report for International Application No. PCT/US2016/056181, dated Jan. 26, 2017, 10 pages.

Extended European Search Report for EP Application No. 16154938.1, dated Jun. 23, 2016, 8 pages.

Extended European Search Report for EP Application No. 16154940.7, dated Jun. 30, 2016, 7 pages.

\* cited by examiner

FREQUENCY RESPONSE OPTIMIZATION CONTROL SYSTEM

CROSS-REFERENCE TO RELATED PATENT APPLICATION

This application claims the benefit of and priority to U.S. Provisional Patent Application No. 62/368,878 filed Jul. 29, 2016, the entire disclosure of which is incorporated by reference herein.

BACKGROUND

The present disclosure relates generally to frequency response systems configured to add or remove electricity from an energy grid, and more particularly to a frequency response controller that determines optimal power setpoints for a battery power inverter in a frequency response system.

Stationary battery storage has several purposes when integrated with campus electrical distribution. For example, battery storage can be used to participate in a local frequency response program. Battery storage can be used to reduce the energy used during times when electricity is expensive and to reduce the electrical demand of a building to reduce the demand charge incurred.

Some frequency response programs allow participants to set the midpoint of regulation around which they must modify their load in response to a regulation signal. However, it is difficult and challenging to determine an optimal adjustment of the midpoint which allows the battery storage controller to actively participate in the frequency response market while also taking into account the energy and demand charge that will be incurred.

SUMMARY

One implementation of the present disclosure is a frequency response optimization system. The system includes a battery that stores and discharges electric power, a power inverter that controls an amount of the electric power stored or discharged from the battery at each of a plurality of time steps during a frequency response period, and a high level controller. The high level controller receives a regulation signal from an incentive provider, determines statistics of the regulation signal, and uses the statistics of the regulation signal to generate a frequency response midpoint. The midpoint maintains the battery at the same state-of-charge at a beginning and an end of the frequency response period while participating in a frequency response program. A low level controller uses the midpoint to determine optimal battery power setpoints for the power inverter. The power inverter uses the optimal battery power setpoints to control the amount of the electric power stored or discharged from the battery.

In some embodiments, the low level controller is a network automation engine controller.

In some embodiments, the low level controller communicates with a battery management unit configured to monitor one or more parameters associated with the battery.

In some embodiments, the parameters include a state of charge (SOC) of the battery, a depth of discharge of the battery, and a battery cell temperature.

In some embodiments, the low level controller communicates with an input/output module in communication with a number of sub-systems associated with the battery.

In some embodiments, the sub-systems includes an environmental system configured to regulate the environment of the battery.

In some embodiments, the sub-systems include a safety system configured to provide safety and security information related to the battery to the low level controller.

In some embodiments, the high level controller includes a battery power loss estimator configured to estimate an amount of power lost in the battery based on the statistics of the regulation signal.

In some embodiments, the high level controller generates filter parameters based on the midpoint. Additionally, the low level controller uses the filter parameters to filter the regulation signal and determines the optimal battery power setpoints using the filtered regulation signal.

In some embodiments, the high level controller generates an objective function. The objective function includes an estimated amount of frequency response revenue that will result from the battery power setpoints, and an estimated cost of battery degradation that will result from the battery power setpoints.

In some embodiments, the frequency response controller implements constraints on the objective function. The constraints may include at least one of constraining a state-of-charge of the battery between a minimum state-of-charge and a maximum state-of-charge and constraining the midpoint such that a sum of the midpoint and a campus power usage does not exceed a maximum power rating of the power inverter.

In some embodiments, the frequency response controller uses a battery life model to determine an estimated cost of battery degradation. The battery life model may include a plurality of variables that depend on the battery power setpoints. The variables may include at least one of a temperature of the battery, a state-of-charge of the battery, a depth of discharge of the battery, a power ratio of the battery, and an effort ratio of the battery.

Another implementation of the present disclosure is a frequency response optimization system. The system includes a battery that stores and discharges electric power, a power inverter that controls an amount of the electric power stored or discharged from the battery at each of a plurality of time steps during a frequency response period, and a high level controller. The high level controller receives a regulation signal from an incentive provider, determines statistics of the regulation signal, and uses the statistics of the regulation signal to generate an optimal frequency response midpoint. The optimal midpoint achieves a desired change in the state-of-charge of the battery while participating in a frequency response program. A low level controller uses the midpoints to determine optimal battery power setpoints for the power inverter. The power inverter uses the optimal battery power setpoints to control the amount of the electric power stored or discharged from the battery.

In some embodiments, the frequency response controller includes a battery power loss estimator that estimates an amount of power lost in the battery based on the statistics of the regulation signal.

In some embodiments, the high level controller generates filter parameters based on the optimal midpoint and a low level controller that uses the filter parameters to filter the regulation signal and determines the optimal battery power setpoints using the filtered regulation signal. In some embodiments, the high level controller generates an objective function including an estimated amount of frequency response revenue that will result from the midpoint and an estimated cost of battery degradation that will result from the midpoint.

In some embodiments, the high level controller implements constraints on the objective function. The constraints may include at least one of constraining a state-of-charge of the battery between a minimum state-of-charge and a maximum state-of-charge and constraining the midpoint such that a sum of the midpoint and a campus power usage does not exceed a maximum power rating of the power inverter.

Another implementation of the present disclosure is an optimization controller for a battery. The optimization controller includes a high level controller that receives a regulation signal from an incentive provider, determines statistics of the regulation signal, and uses the statistics of the regulation signal to generate a frequency response midpoint. The optimization controller further includes a low level controller that uses the frequency response midpoint to determine optimal battery power setpoints and uses the optimal battery power setpoints to control an amount of electric power stored or discharged from the battery during a frequency response period.

In some embodiments, the high level controller determines the frequency response midpoint that maintains the battery at the same state-of-charge at a beginning and an end of the frequency response period while participating in a frequency response program.

In some embodiments, the high level controller determines an optimal frequency response midpoint that achieves a desired change in the state-of-charge of the battery while participating in a frequency response program.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

DETAILED DESCRIPTION

Frequency Response Optimization

Figure 1:
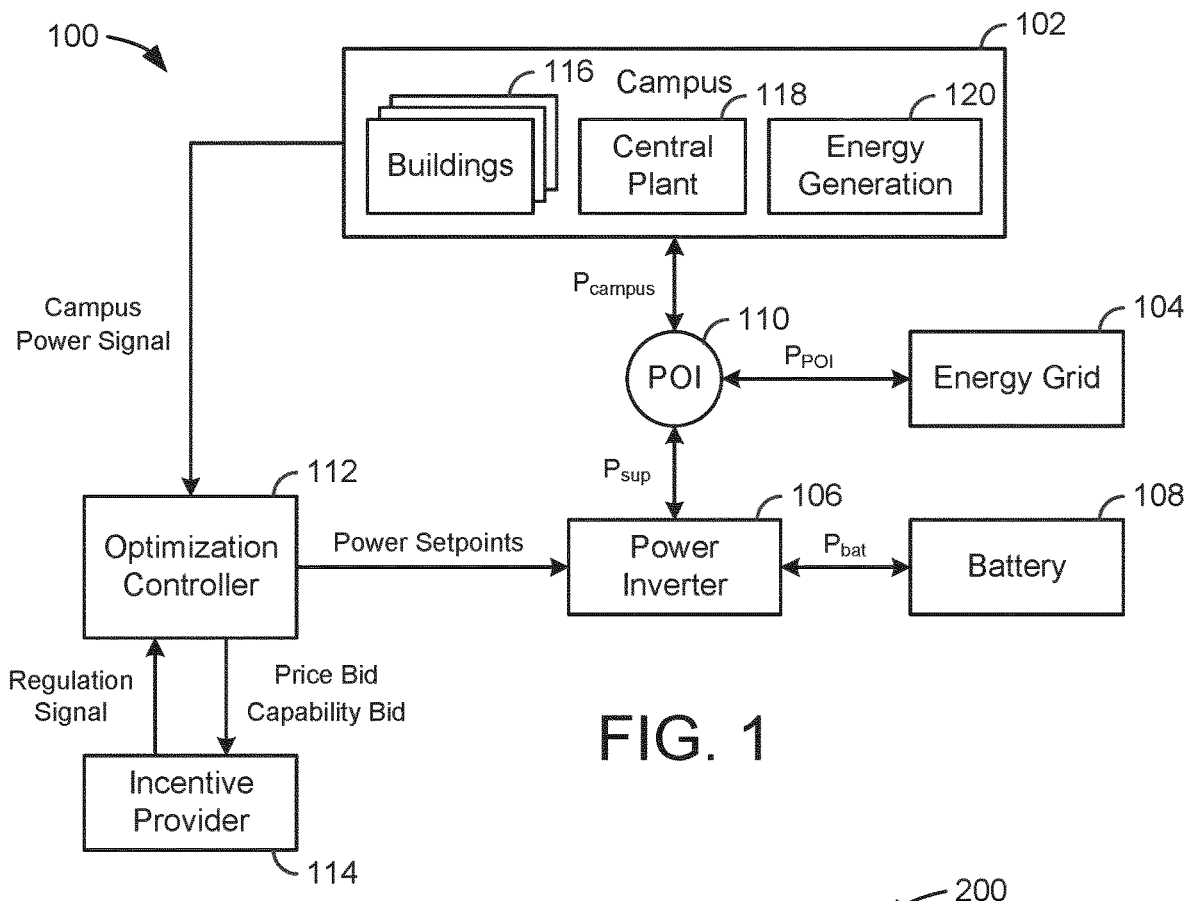
FIG. 1 is a block diagram of a frequency response optimization system, according to some embodiments.

Referring to FIG. 1, a battery optimization system 100 is shown, according to an exemplary embodiment. System 100 is shown to include a campus 102 and an energy grid 104. Campus 102 may include one or more buildings 116 that receive power from energy grid 104. Buildings 116 may include equipment or devices that consume electricity during operation. For example, buildings 116 may include HVAC equipment, lighting equipment, security equipment, communications equipment, vending machines, computers, electronics, elevators, or other types of building equipment. In some embodiments, buildings 116 are served by a building management system (BMS). A BMS is, in general, a system of devices configured to control, monitor, and manage equipment in or around a building or building area. A BMS can include, for example, an HVAC system, a security system, a lighting system, a fire alerting system, and/or any other system that is capable of managing building functions or devices. An exemplary building management system which may be used to monitor and control buildings 116 is described in U.S. patent application Ser. No. 14/717,593, titled "Building Management System for Forecasting Time Series Values of Building Variables" and filed May 20, 2015, the entire disclosure of which is incorporated by reference herein.

In some embodiments, campus 102 includes a central plant 118. Central plant 118 may include one or more subplants that consume resources from utilities (e.g., water, natural gas, electricity, etc.) to satisfy the loads of buildings 116. For example, central plant 118 may include a heater subplant, a heat recovery chiller subplant, a chiller subplant, a cooling tower subplant, a hot thermal energy storage (TES) subplant, and a cold thermal energy storage (TES) subplant, a steam subplant, and/or any other type of subplant configured to serve buildings 116. The subplants may be configured to convert input resources (e.g., electricity, water, natural gas, etc.) into output resources (e.g., cold water, hot water, chilled air, heated air, etc.) that are provided to buildings 116. An exemplary central plant which may be used to satisfy the loads of buildings 116 is described U.S. patent application Ser. No. 14/634,609, titled "High Level Central Plant Optimization" and filed Feb. 27, 2015, the entire disclosure of which is incorporated by reference herein.

In some embodiments, campus 102 includes energy generation 120. Energy generation 120 may be configured to generate energy that can be used by buildings 116, used by central plant 118, and/or provided to energy grid 104. In some embodiments, energy generation 120 generates electricity. For example, energy generation 120 may include an electric power plant, a photovoltaic energy field, or other types of systems or devices that generate electricity. The electricity generated by energy generation 120 can be used internally by campus 102 (e.g., by buildings 116 and/or central plant 118) to decrease the amount of electric power that campus 102 receives from outside sources such as energy grid 104 or battery 108. If the amount of electricity generated by energy generation 120 exceeds the electric power demand of campus 102, the excess electric power can be provided to energy grid 104 or stored in battery 108. The power output of campus 102 is shown in FIG. 1 as $P_{campus}$. $P_{campus}$ may be positive if campus 102 is outputting electric power or negative if campus 102 is receiving electric power.

Still referring to FIG. 1, system 100 is shown to include a power inverter 106 and a battery 108. Power inverter 106 may be configured to convert electric power between direct current (DC) and alternating current (AC). For example, battery 108 may be configured to store and output DC power, whereas energy grid 104 and campus 102 may be configured to consume and generate AC power. Power inverter 106 may be used to convert DC power from battery 108 into a sinusoidal AC output synchronized to the grid frequency of energy grid 104. Power inverter 106 may also be used to convert AC power from campus 102 or energy grid 104 into DC power that can be stored in battery 108. The power output of battery 108 is shown as $P_{bat}$. $P_{bat}$ may be positive if battery 108 is providing power to power inverter 106 or negative if battery 108 is receiving power from power inverter 106.

In some instances, power inverter 106 receives a DC power output from battery 108 and converts the DC power output to an AC power output that can be fed into energy grid 104. Power inverter 106 may synchronize the frequency of the AC power output with that of energy grid 104 (e.g., 50 Hz or 60 Hz) using a local oscillator and may limit the voltage of the AC power output to no higher than the grid voltage. In some embodiments, power inverter 106 is a resonant inverter that includes or uses LC circuits to remove the harmonics from a simple square wave in order to achieve a sine wave matching the frequency of energy grid 104. In various embodiments, power inverter 106 may operate using high-frequency transformers, low-frequency transformers, or without transformers. Low-frequency transformers may convert the DC output from battery 108 directly to the AC output provided to energy grid 104. High-frequency transformers may employ a multi-step process that involves converting the DC output to high-frequency AC, then back to DC, and then finally to the AC output provided to energy grid 104.

System 100 is shown to include a point of interconnection (POI) 110. POI 110 is the point at which campus 102, energy grid 104, and power inverter 106 are electrically connected. The power supplied to POI 110 from power inverter 106 is shown as $P_{sup}$. $P_{sup}$ may be defined as $P_{bat}+P_{loss}$, where $P_{bat}$ is the battery power and $P_{loss}$ is the power loss in the battery system (e.g., losses in power inverter 106 and/or battery 108). $P_{sup}$ may be positive is power inverter 106 is providing power to POI 110 or negative if power inverter 106 is receiving power from POI 110. $P_{campus}$ and $P_{sup}$ combine at POI 110 to form $P_{POI}$. $P_{POI}$ may be defined as the power provided to energy grid 104 from POI 110. $P_{POI}$ may be positive if POI 110 is providing power to energy grid 104 or negative if POI 110 is receiving power from energy grid 104.

Still referring to FIG. 1, system 100 is shown to include an optimization controller 112. Controller 112 may be configured to generate and provide power setpoints to power inverter 106. Power inverter 106 may use the power setpoints to control the amount of power $P_{sup}$ provided to POI 110 or drawn from POI 110. For example, power inverter 106 may be configured to draw power from POI 110 and store the power in battery 108 in response to receiving a negative power setpoint from controller 112. Conversely, power inverter 106 may be configured to draw power from battery 108 and provide the power to POI 110 in response to receiving a positive power setpoint from controller 112. The magnitude of the power setpoint may define the amount of power $P_{sup}$ provided to or from power inverter 106. Controller 112 may be configured to generate and provide power setpoints that optimize the value of operating system 100 over a time horizon.

In some embodiments, optimization controller 112 uses power inverter 106 and battery 108 to perform frequency regulation for energy grid 104. Frequency regulation is the process of maintaining the stability of the grid frequency (e.g., 60 Hz in the United States). The grid frequency may remain stable and balanced as long as the total electric supply and demand of energy grid 104 are balanced. Any deviation from that balance may result in a deviation of the grid frequency from its desirable value. For example, an increase in demand may cause the grid frequency to decrease, whereas an increase in supply may cause the grid frequency to increase. Optimization controller 112 may be configured to offset a fluctuation in the grid frequency by causing power inverter 106 to supply energy from battery 108 to energy grid 104 (e.g., to offset a decrease in grid frequency) or store energy from energy grid 104 in battery 108 (e.g., to offset an increase in grid frequency).

In some embodiments, optimization controller 112 uses power inverter 106 and battery 108 to perform load shifting for campus 102. For example, controller 112 may cause power inverter 106 to store energy in battery 108 when energy prices are low and retrieve energy from battery 108 when energy prices are high in order to reduce the cost of electricity required to power campus 102. Load shifting may also allow system 100 reduce the demand charge incurred. Demand charge is an additional charge imposed by some utility providers based on the maximum power consumption during an applicable demand charge period. For example, a demand charge rate may be specified in terms of dollars per unit of power (e.g., $/kW) and may be multiplied by the peak power usage (e.g., kW) during a demand charge period to calculate the demand charge. Load shifting may allow system 100 to smooth momentary spikes in the electric demand of campus 102 by drawing energy from battery 108 in order to reduce peak power draw from energy grid 104, thereby decreasing the demand charge incurred.

Still referring to FIG. 1, system 100 is shown to include an incentive provider 114. Incentive provider 114 may be a utility (e.g., an electric utility), a regional transmission organization (RTO), an independent system operator (ISO), or any other entity that provides incentives for performing frequency regulation. For example, incentive provider 114 may provide system 100 with monetary incentives for participating in a frequency response program. In order to participate in the frequency response program, system 100 may maintain a reserve capacity of stored energy (e.g., in battery 108) that can be provided to energy grid 104. System 100 may also maintain the capacity to draw energy from energy grid 104 and store the energy in battery 108. Reserving both of these capacities may be accomplished by managing the state-of-charge of battery 108.

Optimization controller 112 may provide incentive provider 114 with a price bid and a capability bid. The price bid may include a price per unit power (e.g., $/MW) for reserving or storing power that allows system 100 to participate in a frequency response program offered by incentive provider 114. The price per unit power bid by optimization controller 112 is referred to herein as the "capability price." The price bid may also include a price for actual performance, referred to herein as the "performance price." The capability bid may define an amount of power (e.g., MW) that system 100 will reserve or store in battery 108 to perform frequency response, referred to herein as the "capability bid."

Incentive provider 114 may provide optimization controller 112 with a capability clearing price $CP_{cap}$, a performance clearing price $CP_{perf}$ and a regulation award $Reg_{award}$, which correspond to the capability price, the performance price, and the capability bid, respectively. In some embodiments, $CP_{cap}$, $CP_{perf}$ and $Reg_{award}$ are the same as the corresponding bids placed by controller 112. In other embodiments, $CP_{cap}$, $CP_{perf}$ and $Reg_{award}$ may not be the same as the bids placed by controller 112. For example, $CP_{cap}$, $CP_{perf}$ and $Reg_{award}$ may be generated by incentive provider 114 based on bids received from multiple participants in the frequency response program. Controller 112 may use $CP_{cap}$, $CP_{perf}$ and $Reg_{award}$ to perform frequency regulation, described in greater detail below.

Optimization controller 112 is shown receiving a regulation signal from incentive provider 114. The regulation signal may specify a portion of the regulation award $Reg_{award}$ that optimization controller 112 is to add or remove from energy grid 104. In some embodiments, the regulation signal is a normalized signal (e.g., between −1 and 1) specifying a proportion of $Reg_{award}$. Positive values of the regulation signal may indicate an amount of power to add to energy grid 104, whereas negative values of the regulation signal may indicate an amount of power to remove from energy grid 104.

The optimization controller 112 may respond to the regulation signal by generating an optimal power setpoint for power inverter 106. The optimal power setpoint may take into account both the potential revenue from participating in the frequency response program and the costs of participation. Costs of participation may include, for example, a monetized cost of battery degradation as well as the energy and demand charges that will be incurred. The optimization may be performed using sequential quadratic programming, dynamic programming, or any other optimization technique.

In some embodiments, controller 112 uses a battery life model to quantify and monetize battery degradation as a function of the power setpoints provided to power inverter 106. Advantageously, the battery life model allows controller 112 to perform an optimization that weighs the revenue generation potential of participating in the frequency response program against the cost of battery degradation and other costs of participation (e.g., less battery power available for campus 102, increased electricity costs, etc.). An exemplary regulation signal and power response are described in greater detail with reference to FIG. 2.

Figure 2:
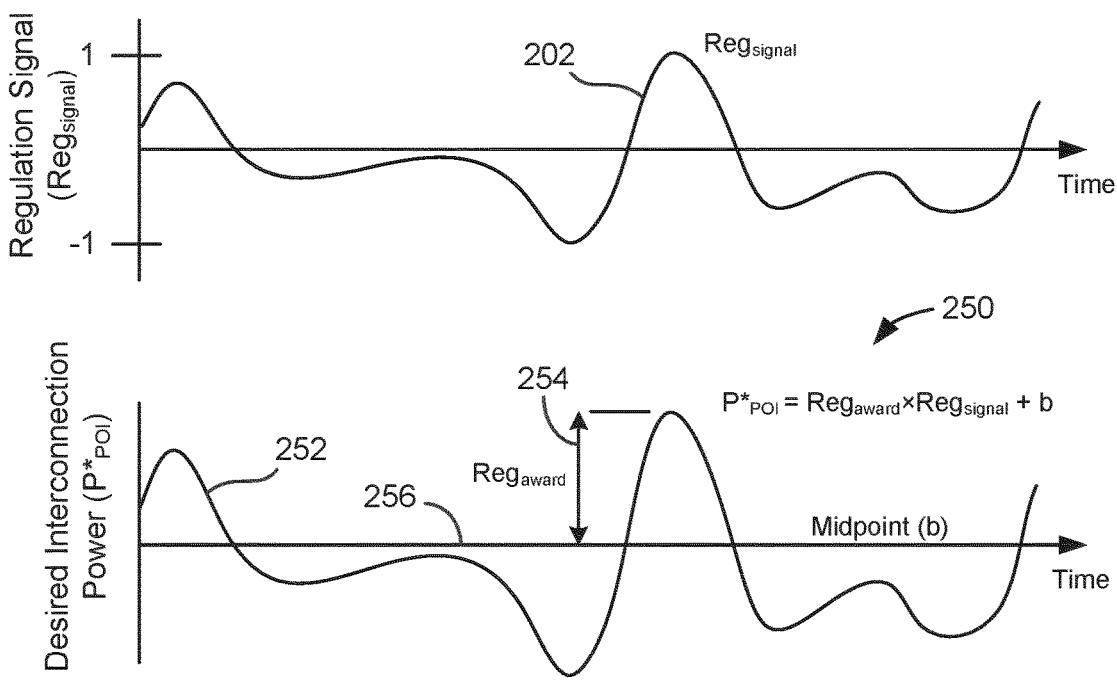
FIG. 2 is a graph of a regulation signal which may be provided to the system of FIG. 1 and a frequency response signal which may be generated by the system of FIG. 1, according to some embodiments.

Referring now to FIG. 2, a pair of frequency response graphs 200 and 250 are shown, according to an exemplary embodiment. Graph 200 illustrates a regulation signal $Reg_{signal}$ 202 as a function of time. $Reg_{signal}$ 202 is shown as a normalized signal ranging from −1 to 1 (i.e., $-1 \leq Reg_{signal} \leq 1$). $Reg_{signal}$ 202 may be generated by incentive provider 114 and provided to optimization controller 112. $Reg_{signal}$ 202 may define a proportion of the regulation award $Reg_{award}$ 254 that controller 112 is to add or remove from energy grid 104, relative to a baseline value referred to as the midpoint b 256. For example, if the value of $Reg_{award}$ 254 is 10 MW, a regulation signal value of 0.5 (i.e., $Reg_{signal}=0.5$) may indicate that system 100 is requested to add 5 MW of power at POI 110 relative to midpoint b (e.g., $P^*_{POI}=10$ MW×0.5+b), whereas a regulation signal value of −0.3 may indicate that system 100 is requested to remove 3 MW of power from POI 110 relative to midpoint b (e.g., $P^*_{POI}=10$ MW×−0.3+b).

Graph 250 illustrates the desired interconnection power $P^*_{POI}$ 252 as a function of time. $P^*_{POI}$ 252 may be calculated by optimization controller 112 based on $Reg_{signal}$ 202, $Reg_{award}$ 254, and a midpoint b 256. For example, controller 112 may calculate $P^*_{POI}$ 252 using the following equation:

$$P^*_{POI}=Reg_{award} \times Reg_{signal}+b$$

where $P^*_{POI}$ represents the desired power at POI 110 (e.g., $P^*_{POI}=P_{sup}+P_{campus}$) and b is the midpoint. Midpoint b may be defined (e.g., set or optimized) by controller 112 and may represent the midpoint of regulation around which the load is modified in response to $Reg_{signal}$ 202. Optimal adjustment of midpoint b may allow controller 112 to actively participate in the frequency response market while also taking into account the energy and demand charge that will be incurred.

In order to participate in the frequency response market, controller 112 may perform several tasks. Controller 112 may generate a price bid (e.g., $/MW) that includes the capability price and the performance price. In some embodiments, controller 112 sends the price bid to incentive provider 114 at approximately 15:30 each day and the price bid remains in effect for the entirety of the next day. Prior to beginning a frequency response period, controller 112 may generate the capability bid (e.g., MW) and send the capability bid to incentive provider 114. In some embodiments, controller 112 generates and sends the capability bid to incentive provider 114 approximately 1.5 hours before a frequency response period begins. In an exemplary embodiment, each frequency response period has a duration of one hour; however, it is contemplated that frequency response periods may have any duration.

At the start of each frequency response period, controller 112 may generate the midpoint b around which controller 112 plans to perform frequency regulation. In some embodiments, controller 112 generates a midpoint b that will maintain battery 108 at a constant state-of-charge (SOC) (i.e. a midpoint that will result in battery 108 having the same SOC at the beginning and end of the frequency response period). In other embodiments, controller 112 generates midpoint b using an optimization procedure that allows the SOC of battery 108 to have different values at the beginning and end of the frequency response period. For example, controller 112 may use the SOC of battery 108 as a constrained variable that depends on midpoint b in order to optimize a value function that takes into account frequency response revenue, energy costs, and the cost of battery degradation. Exemplary processes for calculating and/or optimizing midpoint b under both the constant SOC scenario and the variable SOC scenario are described in greater detail with reference to FIGS. 3-4.

During each frequency response period, controller 112 may periodically generate a power setpoint for power inverter 106. For example, controller 112 may generate a power setpoint for each time step in the frequency response period. In some embodiments, controller 112 generates the power setpoints using the equation:

$$P^*_{POI}=Reg_{award} \times Reg_{signal}+b$$

where $P^*_{POI}=P_{sup}+P_{campus}$. Positive values of $P^*_{POI}$ indicate energy flow from POI 110 to energy grid 104. Positive values of $P_{sup}$ and $P_{campus}$ indicate energy flow to POI 110 from power inverter 106 and campus 102, respectively. In other embodiments, controller 112 generates the power setpoints using the equation:

$$P^*_{POI}=Reg_{award} \times Res_{FR}+b$$

where $Res_{FR}$ is an optimal frequency response generated by optimizing a value function (described in greater detail below). Controller 112 may subtract $P_{campus}$ from $P^*_{POI}$ to generate the power setpoint for power inverter 106 (i.e., $P_{sup}=P^*_{POI}-P_{campus}$). The power setpoint for power inverter 106 indicates the amount of power that power inverter 106 is to add to POI 110 (if the power setpoint is positive) or remove from POI 110 (if the power setpoint is negative).

Optimization Control System

Figure 3:
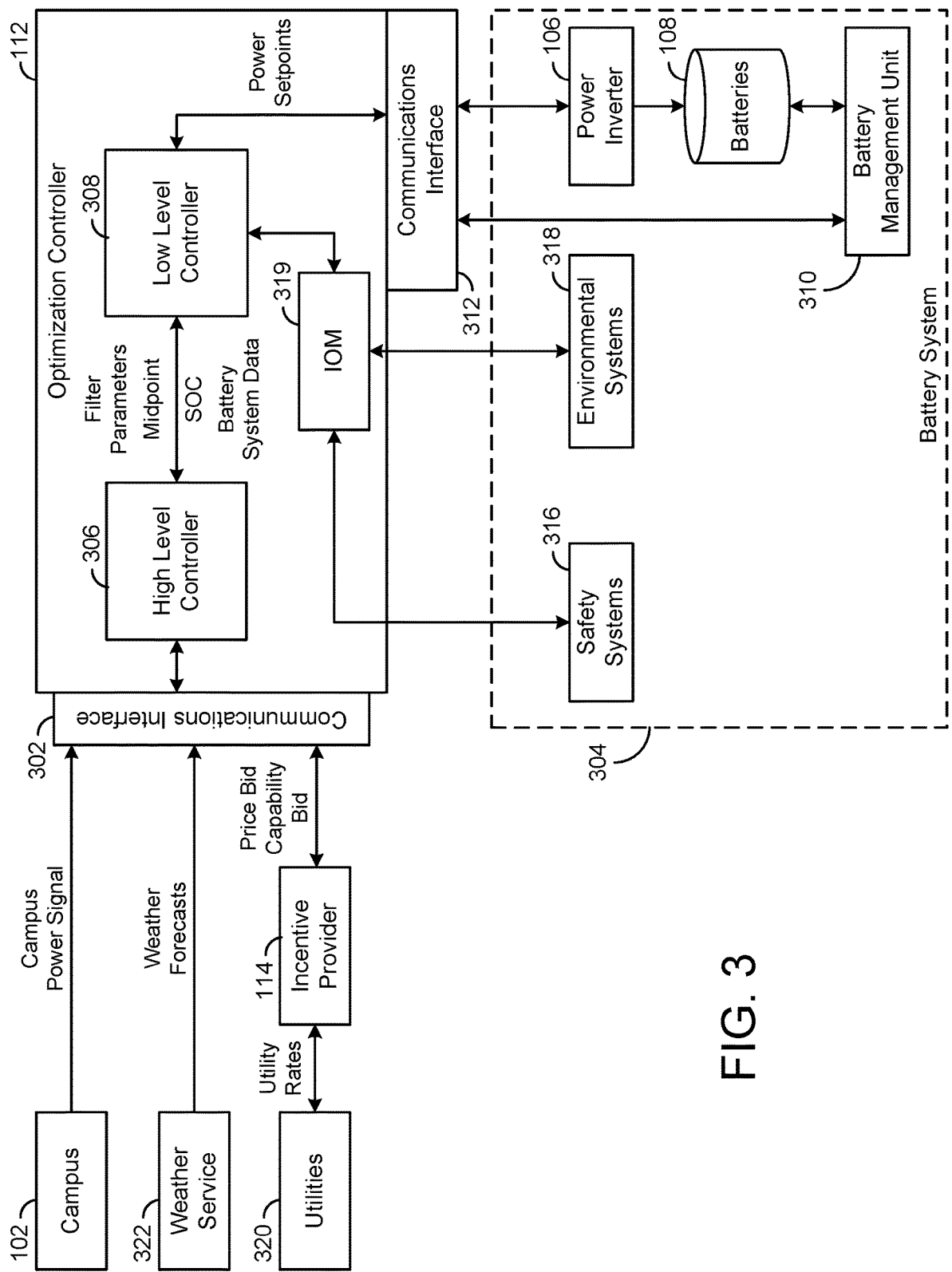
FIG. 3 is a block diagram illustrating the optimization controller of FIG. 1 in greater detail, according to some embodiments.

Referring now to FIG. 3, a block diagram illustrating optimization controller 112 in greater detail is shown, according to an exemplary embodiment. Optimization controller 112 may be configured to perform an optimization process to generate values for the bid price, the capability bid, and the midpoint b. In some embodiments, optimization controller 112 generates values for the bids and the midpoint b periodically using a predictive optimization scheme (e.g., once every half hour, once per frequency response period, etc.). Optimization controller 112 may also calculate and update power setpoints for power inverter 106 periodically during each frequency response period (e.g., once every two seconds). As shown in FIG. 3, optimization controller 112 is in communication with one or more external systems via communication interface 302. Additionally, optimization controller 112 is also shown as being in communication with a battery system 304.

In some embodiments, the interval at which optimization controller 112 generates power setpoints for power inverter 106 is significantly shorter than the interval at which optimization controller 112 generates the bids and the midpoint b. For example, optimization controller 112 may generate values for the bids and the midpoint b every half hour, whereas optimization controller 112 may generate a power setpoint for power inverter 106 every two seconds. The difference in these time scales allows optimization controller 112 to use a cascaded optimization process to generate optimal bids, midpoints b, and power setpoints.

In the cascaded optimization process, a high level controller 306 determines optimal values for the bid price, the capability bid, and the midpoint b by performing a high level optimization. High level controller 306 may be a centralized server within the optimization controller 112. High level controller 306 may be configured to execute optimization control algorithms, such as those described herein. In one embodiment, high level controller 306 is be configured to run an optimization engine, such as a MATLAB optimization engine. High level controller 306 is described in more detail below.

Further, the cascaded optimization process allows for multiple controllers to process different portions of the optimization process. As described below, high level controller 306 may be used to perform optimization functions based on received data, while a low level controller 308 may receive optimization data from high level controller 306 and control battery system 304 accordingly. By allowing independent platforms to perform separation portions of the optimization, the individual platforms may be scaled and tuned independently. For example, optimization controller 112 may be able to be scaled up to accommodate a larger battery system 304 by adding additional low level controllers to control battery system 304. Further, high level controller 306 may be modified to provide additional computing power for optimizing battery system 304 in more complex systems. Further, modifications to either high level controller 306 or low level controller 308 may not affect the other, thereby increasing overall system stability and availability.

High level controller 306 may select midpoint b to maintain a constant state-of-charge in battery 108 (i.e., the same state-of-charge at the beginning and end of each frequency response period) or to vary the state-of-charge in order to optimize the overall value of operating system 100 (e.g., frequency response revenue minus energy costs and battery degradation costs), as described below. High level controller 306 may also determine filter parameters for a signal filter (e.g., a low pass filter) used by low level controller 308.

Low level controller 308 may be a standalone controller. In one embodiment, low level controller 308 is a Network Automation Engine (NAE) controller from Johnson Controls. However, other controllers having the capabilities described herein are also contemplated. Low level controller 308 may have sufficient memory and computing power to run the applications, described below, at the required frequencies. For example, certain optimization control loops (described below) may require control loops running at 200 ms intervals. However, intervals of more than 200 ms and less than 200 ms may also be required. These control loops may require reading and writing data to and from the battery inverter. Low level controller 308 may support Ethernet connectivity (or other network connectivity) to connect to a network for receiving both operational data, as well as configuration data.

Low level controller 308 may be capable of quickly controlling one or more devices around one or more setpoints. For example, low level controller 308 can use the midpoint b and the filter parameters from high level controller 306 to perform a low level optimization in order to generate the power setpoints for power inverter 106. Advantageously, low level controller 308 may determine how closely to track the desired power $P^*_{POI}$ at the point of interconnection 110. For example, the low level optimization performed by low level controller 308 may consider not only frequency response revenue but also the costs of the power setpoints in terms of energy costs and battery degradation. In some instances, low level controller 308 may determine that it is deleterious to battery 108 to follow the regulation exactly and may sacrifice a portion of the frequency response revenue in order to preserve the life of battery 108.

Low level controller 308 may also be configured to interface with one or more other devises or systems. For example, low level controller 308 may communicate with power inverter 106 and/or battery management unit 310 via a low level controller communications interface 312. Communications interface 312 may include wired or wireless interfaces (e.g., jacks, antennas, transmitters, receivers, transceivers, wire terminals, etc.) for conducting data communications with various systems, devices, or networks. For example, communications interface 312 may include an Ethernet card and port for sending and receiving data via an Ethernet-based communications network and/or a Wi-Fi transceiver for communicating via a wireless communications network. Communications interface 312 may be configured to communicate via local area networks or wide area networks (e.g., the Internet, a building WAN, etc.) and may use a variety of communications protocols (e.g., BACnet, MODBUS, CAN, IP, LON, etc.).

As described above, low level controller 308 may communicate setpoints to power inverter 106. Furthermore, low level controller 308 may receive data from battery management unit 310 via communication interface 312. Battery management unit 310 may provide data relating to a state of charge (SOC) of batteries 108. Battery management unit 310 may further provide data relating to other parameters of batteries 108, such as temperature, real time or historical voltage level values, real time or historical current values, etc. Low level controller 308 may be configured to perform time critical functions of optimization controller 112. For example, low level controller 308 may be able to perform fast loop (PID, PD, PI, etc.) controls in real time. In some embodiments, low level controller 308 provides power setpoints to power inverter 106 via communications interface 312.

Low level controller 308 may further control a number of other systems or devices associated with battery system 304. For example, low level controller may control safety systems 316 and/or environmental systems 318. In one embodiment, low level controller 308 may communicate with and control safety systems 316 and/or environmental systems 318 through an input/output module (IOM) 319. In one example, IOM 319 may be an IOM controller from Johnson Controls. IOM 319 may be configured to receive data from low level controller and then output discrete control signals to safety systems 316 and/or environmental systems 318. Further, IOM 319 may receive discrete outputs from safety systems 316 and/or environmental systems 318, and report those values to low level controller 308. For example, IOM 319 may provide binary outputs to environmental system 318, such as a temperature setpoint. In return, IOM 319 may receive one or more analog inputs corresponding to temperatures or other parameters associated with environmental systems 318. Similarly, safety systems 316 may provide binary inputs to IOM 319 indicating the status of one or more safety systems or devices within battery system 304. IOM 319 may be able to process multiple data points from devices within battery system 304. Further, IOM 319 may be configured to receive and output a variety of analog signals (4-20 mA, 0-5V, etc.) as well as binary signals.

Environmental systems 318 may include HVAC devices such as roof-top units (RTUs), air handling units (AHUs), etc. Environmental systems 318 may be coupled to battery system 304 to provide environmental regulation of battery system 304. For example, environmental systems 318 may provide cooling for battery system 304. In one example, battery system 304 may be contained within an environmentally sealed container. Environmental systems 318 may then be used to not only provide airflow through battery system 304, but also to condition the air to provide additional cooling to batteries 108 and/or power inverter 106. Environmental systems 318 may also provide environmental services such as air filtration, liquid cooling, heating, etc. Safety systems 316 may provide various safety controls and interlocks associated with the battery system 304. For example, safety systems 316 may monitor one or more contacts associated with access points on battery system 304. Where a contact indicates that an access point is being accessed, safety systems 316 may communicate the associated data to low level controller 308 via IOM 319. Low level controller 308 may then generate and alarm and/or shut down battery system 304 to prevent any injury to a person accessing battery system 304 during operation. Further examples of safety systems can include air quality monitors, smoke detectors, fire suppression systems, etc.

Still referring to FIG. 3, optimization controller 112 is shown to include a high level controller communications interface 302. Communications interface 302 may include wired or wireless interfaces (e.g., jacks, antennas, transmitters, receivers, transceivers, wire terminals, etc.) for conducting data communications with various systems, devices, or networks. For example, communications interface 302 may include an Ethernet card and port for sending and receiving data via an Ethernet-based communications network and/or a Wi-Fi transceiver for communicating via a wireless communications network. Communications interface 302 may be configured to communicate via local area networks or wide area networks (e.g., the Internet, a building WAN, etc.) and may use a variety of communications protocols (e.g., BACnet, IP, LON, etc.).

Communications interface 302 may be a network interface configured to facilitate electronic data communications between optimization controller 112 and various external systems or devices (e.g., campus 102, energy grid 104, incentive provider 114, utilities 320, weather service 322, etc.). For example, optimization controller 112 may receive inputs from incentive provider 114 indicating an incentive event history (e.g., past clearing prices, mileage ratios, participation requirements, etc.) and a regulation signal. Further, the incentive provider 114 may communicate utility rates provided by utilities 320. Optimization controller 112 may receive a campus power signal from campus 102, and weather forecasts from weather service 322 via communications interface 302. Optimization controller 112 may provide a price bid and a capability bid to incentive provider 114 and may provide power setpoints to power inverter 106 via communications interface 302.

As described above, high level controller 306 may be configured to generate values for the midpoint b and the capability bid $Reg_{award}$. In some embodiments, high level controller 306 determines a midpoint b that will cause battery 108 to have the same state-of-charge (SOC) at the beginning and end of each frequency response period. In other embodiments, high level controller 306 performs an optimization process to generate midpoint b and $Reg_{award}$. For example, high level controller 306 may generate midpoint b using an optimization procedure that allows the SOC of battery 108 to vary and/or have different values at the beginning and end of the frequency response period. High level controller 306 may use the SOC of battery 108 as a constrained variable that depends on midpoint b in order to optimize a value function that takes into account frequency response revenue, energy costs, and the cost of battery degradation. The SOC of the batteries 108 may be provided by the battery management unit 310 via the low level controller 308. Both of these embodiments are described in greater detail with reference to FIG. 4.

High level controller 306 may determine midpoint b by equating the desired power $P^*_{POI}$ at POI 110 with the actual power at POI 110 as shown in the following equation:

$$(Reg_{signal})(Reg_{award})+b=P_{bat}+P_{loss}+P_{campus}$$

where the left side of the equation $(Reg_{signal})(Reg_{award})+b$ is the desired power $P^*_{POI}$ at POI 110 and the right side of the equation is the actual power at POI 110. Integrating over the frequency response period results in the following equation:

$$\int_{period} ((Reg_{signal})(Reg_{award}) + b)dt = \int_{period} (P_{bat} + P_{loss} + P_{campus})dt$$

For embodiments in which the SOC of battery 108 is maintained at the same value at the beginning and end of the frequency response period, the integral of the battery power $P_{bat}$ over the frequency response period is zero (i.e., $\int P_{bat} dt = 0$). Accordingly, the previous equation can be rewritten as follows:

$$b = \int_{period} P_{loss} dt + \int_{period} P_{campus} dt - Reg_{award} \int_{period} Reg_{signal} dt$$

where the term $\int P_{bat} dt$ has been omitted because $\int P_{bat} dt=0$. This is ideal behavior if the only goal is to maximize frequency response revenue. Keeping the SOC of battery 108 at a constant value (and near 50%) will allow system 100 to participate in the frequency market during all hours of the day.

High level controller 306 may use the estimated values of the campus power signal received from campus 102 to predict the value of $\int P_{campus} dt$ over the frequency response period. Similarly, high level controller 306 may use the estimated values of the regulation signal from incentive provider 114 to predict the value of $\int Reg_{signal} dt$ over the frequency response period. High level controller 306 may estimate the value of $\int P_{loss}\,dt$ using a Thevinin equivalent circuit model of battery 108 (described in greater detail with reference to FIG. 4). This allows high level controller 306 to estimate the integral $\int P_{loss}\,dt$ as a function of other variables such as $Reg_{award}$, $Reg_{signal}$, $P_{campus}$, and midpoint b.

After substituting known and estimated values, the preceding equation can be rewritten as follows:

$$\frac{1}{4P_{max}}[E\{P_{campus}^2\} + Reg_{award}^2 E\{Reg_{signal}^2\} -$$

$$2Reg_{award}E\{Reg_{signal}\}E\{P_{campus}\}]\Delta t +$$

$$[Reg_{award}E\{Reg_{signal}\} - E\{P_{campus}\}]\Delta t +$$

$$\frac{b}{2P_{max}}[Reg_{award}E\{Reg_{signal}\} - E\{P_{campus}\}]\Delta t +$$

$$b\Delta t + \frac{b^2}{4P_{max}}\Delta t = 0$$

where the notation $E\{\ \}$ indicates that the variable within the brackets $\{\ \}$ is ergodic and can be approximated by the estimated mean of the variable. For example, the term $E\{Reg_{signal}\}$ can be approximated by the estimated mean of the regulation signal $\mu_{FR}$ and the term $E\{P_{campus}\}$ can be approximated by the estimated mean of the campus power signal $\mu_{campus}$. High level controller 306 may solve the equation for midpoint b to determine the midpoint b that maintains battery 108 at a constant state-of-charge.

For embodiments in which the SOC of battery 108 is treated as a variable, the SOC of battery 108 may be allowed to have different values at the beginning and end of the frequency response period. Accordingly, the integral of the battery power $P_{bat}$ over the frequency response period can be expressed as $-\Delta SOC \cdot C_{des}$ as shown in the following equation:

$$\int_{period} P_{bat}\,dt = -\Delta SOC \cdot C_{des}$$

where $\Delta SOC$ is the change in the SOC of battery 108 over the frequency response period and $C_{des}$ is the design capacity of battery 108. The SOC of battery 108 may be a normalized variable (i.e., $0 \le SOC \le 1$) such that the term $SOC \cdot C_{des}$ represents the amount of energy stored in battery 108 for a given state-of-charge. The SOC is shown as a negative value because drawing energy from battery 108 (i.e., a positive $P_{bat}$) decreases the SOC of battery 108. The equation for midpoint b becomes:

$$b = \int_{period} P_{loss}\,dt + \int_{period} P_{campus}\,dt +$$

$$\int_{period} P_{bat}\,dt - Reg_{award}\int_{period} Reg_{signal}\,dt$$

After substituting known and estimated values, the preceding equation can be rewritten as follows:

$$\frac{1}{4P_{max}}[E\{P_{campus}^2\} + Reg_{award}^2 +$$

$$E\{Reg_{signal}^2\} - 2Reg_{award}E\{Reg_{signal}\}E\{P_{campus}\}]\Delta t +$$

-continued $$[Reg_{award}E\{Reg_{signal}\} + E\{P_{campus}\}]\Delta t + \Delta SOC \cdot C_{des} +$$

$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

High level controller 306 may solve the equation for midpoint b in terms of $\Delta SOC$.

High level controller 306 may perform an optimization to find optimal midpoints b for each frequency response period within an optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where $Rev(Reg_{award,k})$ is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. The electricity cost is expressed as a positive value because drawing power from energy grid 104 is represented as a negative power and therefore will result in negative value (i.e., a cost) in the objective function. The demand charge is expressed as a minimum for the same reason (i.e., the most negative power value represents maximum power draw from energy grid 104).

High level controller 306 may estimate the frequency response revenue $Rev(Reg_{award,k})$ as a function of the midpoints b. In some embodiments, high level controller 306 estimates frequency response revenue using the following equation:

$$Rev(Reg_{award}) = Reg_{award}(CP_{cap} + MR \cdot CP_{perf})$$

where $CP_{cap}$, MR, and $CP_{perf}$ are the energy market statistics received from energy market predictor 414 and $Reg_{award}$ is a function of the midpoint b. For example, high level controller 306 may place a bid that is as large as possible for a given midpoint, as shown in the following equation:

$$Reg_{award} = P_{limit} - |b|$$

where $P_{limit}$ is the power rating of power inverter 106. Advantageously, selecting $Reg_{award}$ as a function of midpoint b allows high level controller 306 to predict the frequency response revenue that will result from a given midpoint b.

High level controller 306 may estimate the cost of battery degradation $\lambda_{bat}$ as a function of the midpoints b. For example, high level controller 306 may use a battery life model to predict a loss in battery capacity that will result from a set of midpoints b, power outputs, and/or other variables that can be manipulated by controller 112. In some embodiments, the battery life model expresses the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$\left(e.g., PR = avg\left(\frac{P}{P_{des}}\right)\right),$$

and ER is the average effort ratio (e.g., $$ER = avg\left(\frac{\Delta P}{P_{des}}\right)$$

of battery 108. Each of these terms is described in greater detail with reference to FIG. 4. Advantageously, several of the terms in the battery life model depend on the midpoints b and power setpoints selected by controller 112. This allows high level controller 306 to predict a loss in battery capacity that will result from a given set of control outputs. High level controller 306 may monetize the loss in battery capacity and include the monetized cost of battery degradation $\lambda_{bat}$ in the objective function J.

In some embodiments, high level controller 306 generates a set of filter parameters for low level controller 308. The filter parameters may be used by low level controller 308 as part of a low-pass filter that removes high frequency components from the regulation signal. In some embodiments, high level controller 306 generates a set of filter parameters that transform the regulation signal into an optimal frequency response signal $Res_{FR}$. For example, high level controller 306 may perform a second optimization process to determine an optimal frequency response $Res_{FR}$ based on the optimized values for $Reg_{award}$ and midpoint b.

In some embodiments, high level controller 306 determines the optimal frequency response $Res_{FR}$ by optimizing value function J with the frequency response revenue Rev($Reg_{award}$) defined as follows:

$$Rev(Reg_{award}) = PS \cdot Reg_{award}(CP_{cap} + MR \cdot CP_{perf})$$

and with the frequency response $Res_{FR}$ substituted for the regulation signal in the battery life model. The performance score PS may be based on several factors that indicate how well the optimal frequency response $Res_{FR}$ tracks the regulation signal. Closely tracking the regulation signal may result in higher performance scores, thereby increasing the frequency response revenue. However, closely tracking the regulation signal may also increase the cost of battery degradation $\lambda_{bat}$. The optimized frequency response $Res_{FR}$ represents an optimal tradeoff between decreased frequency response revenue and increased battery life. High level controller 306 may use the optimized frequency response $Res_{FR}$ to generate a set of filter parameters for low level controller 308. These and other features of high level controller 306 are described in greater detail with reference to FIG. 4.

Still referring to FIG. 3, low level controller 308 is shown receiving the midpoints b and the filter parameters from high level controller 306. Low level controller 308 may also receive the campus power signal from campus 102 and the regulation signal from incentive provider 114. Low level controller 308 may use the regulation signal to predict future values of the regulation signal and may filter the predicted regulation signal using the filter parameters provided by high level controller 306.

Low level controller 308 may use the filtered regulation signal to determine optimal power setpoints for power inverter 106. For example, low level controller 308 may use the filtered regulation signal to calculate the desired interconnection power $P^*_{POI}$ using the following equation:

$$P^*_{POI} = Reg_{award} \cdot Reg_{filter} + b$$

where $Reg_{filter}$ is the filtered regulation signal. Low level controller 308 may subtract the campus power $P_{campus}$ from the desired interconnection power $P^*_{POI}$ to calculate the optimal power setpoints $P_{SP}$ for power inverter 106, as shown in the following equation:

$$P_{SP} = P^*_{POI} - P_{campus}$$

In some embodiments, low level controller 308 performs an optimization to determine how closely to track $P^*_{POI}$. For example, low level controller 308 may determine an optimal frequency response $Res_{FR}$ by optimizing value function J with the frequency response revenue Rev($Reg_{award}$) defined as follows:

$$Rev(Reg_{award}) = PS \cdot Reg_{award}(CP_{cap} + MR \cdot CP_{perf})$$

and with the frequency response $Res_{FR}$ substituted for the regulation signal in the battery life model. Low level controller 308 may use the optimal frequency response $Res_{FR}$ in place of the filtered frequency response $Reg_{filter}$ to calculate the desired interconnection power $P^*_{POI}$ and power setpoints $P_{SP}$ as previously described. These and other features of low level controller 308 are described in greater detail with reference to FIG. 5.

High Level Controller

Figure 4:
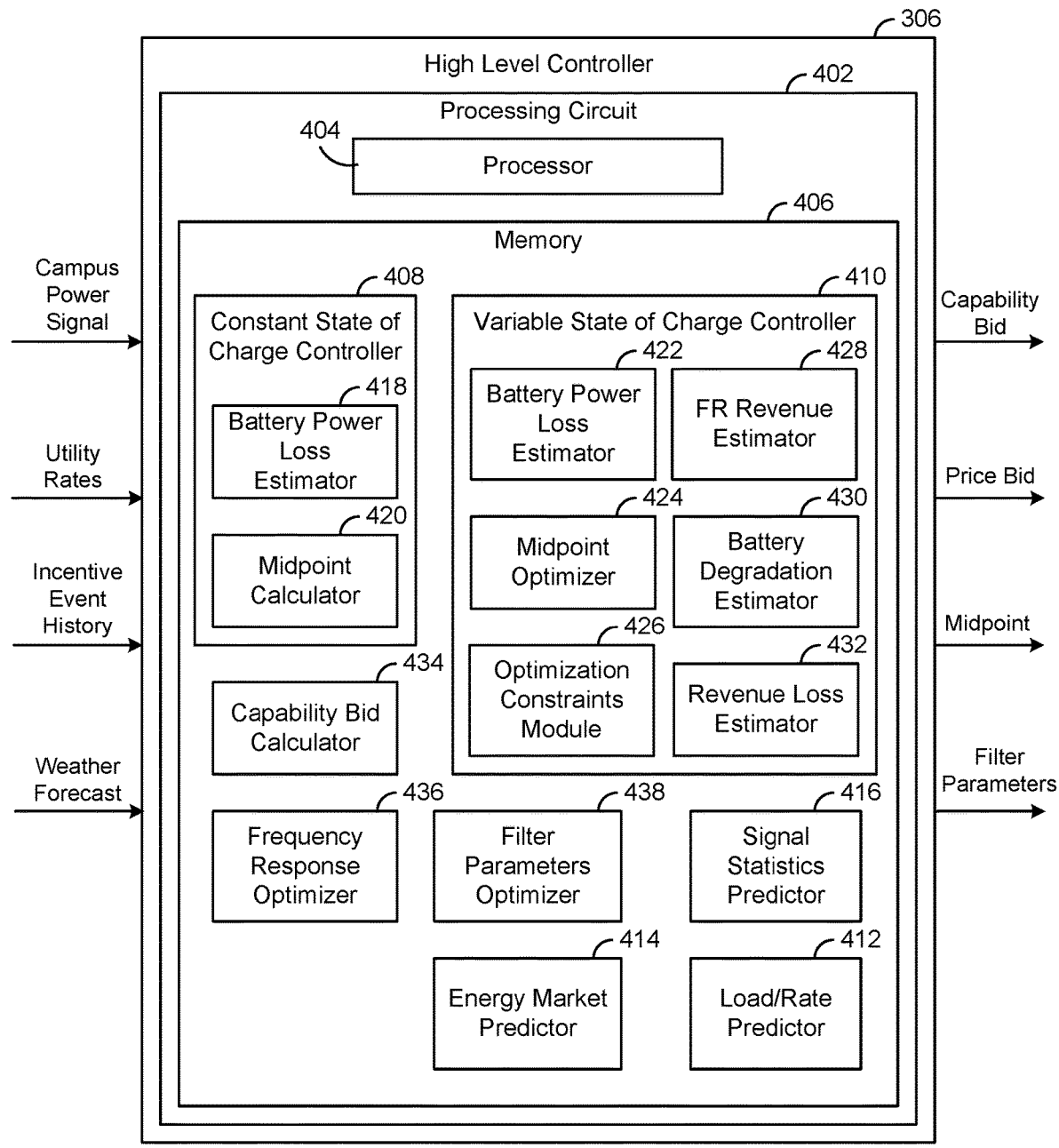
FIG. 4 is a block diagram illustrating the high level controller of FIG. 3 in greater detail, according to some embodiments.

Referring now to FIG. 4, a block diagram illustrating high level controller 306 in greater detail is shown, according to an exemplary embodiment. High level controller 306 is shown to include a processing circuit 402. The processing circuit 402 is shown to include a processor 404 and memory 406. Processor 404 may be a general purpose or specific purpose processor, an application specific integrated circuit (ASIC), one or more field programmable gate arrays (FPGAs), a group of processing components, or other suitable processing components. Processor 404 may be configured to execute computer code or instructions stored in memory 406 or received from other computer readable media (e.g., CDROM, network storage, a remote server, etc.).

Memory 406 may include one or more devices (e.g., memory units, memory devices, storage devices, etc.) for storing data and/or computer code for completing and/or facilitating the various processes described in the present disclosure. Memory 406 may include random access memory (RAM), read-only memory (ROM), hard drive storage, temporary storage, non-volatile memory, flash memory, optical memory, or any other suitable memory for storing software objects and/or computer instructions. Memory 406 may include database components, object code components, script components, or any other type of information structure for supporting the various activities and information structures described in the present disclosure. Memory 406 may be communicably connected to processor 404 via processing circuit 402 and may include computer code for executing (e.g., by processor 404) one or more processes described herein.

High level controller 306 may further include a constant state-of-charge (SOC) controller 408 and a variable SOC controller 410. Constant SOC controller 408 may be configured to generate a midpoint b that results in battery 108 having the same SOC at the beginning and the end of each frequency response period. In other words, constant SOC controller 408 may determine a midpoint b that maintains battery 108 at a predetermined SOC at the beginning of each frequency response period. Variable SOC controller 410 may generate midpoint b using an optimization procedure that allows the SOC of battery 108 to have different values at the beginning and end of the frequency response period. In other words, variable SOC controller 410 may determine a midpoint b that results in a net change in the SOC of battery 108 over the duration of the frequency response period.

Still referring to FIG. 4, high level controller 306 is shown to further include a load/rate predictor 412. Load/rate predictor 412 may be configured to predict the electric load of campus 102 (i.e., $\hat{P}_{campus}$) for each time step k (e.g., k=1 . . . n) within an optimization window. Load/rate predictor 412 is shown receiving weather forecasts from a weather service 322. In some embodiments, load/rate predictor 412 predicts $\hat{P}_{campus}$ as a function of the weather forecasts. In some embodiments, load/rate predictor 412 uses feedback from campus 102 to predict $\hat{P}_{campus}$. Feedback from campus 102 may include various types of sensory inputs (e.g., temperature, flow, humidity, enthalpy, etc.) or other data relating to buildings 116, central plant 118, and/or energy generation 120 (e.g., inputs from a HVAC system, a lighting control system, a security system, a water system, a PV energy system, etc.). Load/rate predictor 412 may predict one or more different types of loads for campus 102. For example, load/rate predictor 412 may predict a hot water load, a cold water load, and/or an electric load for each time step k within the optimization window.

In some embodiments, load/rate predictor 412 receives a measured electric load and/or previous measured load data from campus 102. For example, load/rate predictor 412 may receive a campus power signal from campus 102. The campus power signal may indicate the measured electric load of campus 102. Load/rate predictor 412 may predict one or more statistics of the campus power signal including, for example, a mean campus power $\mu_{campus}$ and a standard deviation of the campus power or $\sigma_{campus}$. Load/rate predictor 412 may predict $\hat{P}_{campus}$ as a function of a given weather forecast ($\hat{\phi}_w$), a day type (day), the time of day (t), and previous measured load data ($Y_{k-1}$). Such a relationship is expressed in the following equation:

$$\hat{P}_{campus} = f(\hat{\phi}_w, day, t | Y_{k-1})$$

In some embodiments, load/rate predictor 412 uses a deterministic plus stochastic model trained from historical load data to predict $\hat{P}_{campus}$. Load/rate predictor 412 may use any of a variety of prediction methods to predict $\hat{P}_{campus}$ (e.g., linear regression for the deterministic portion and an AR model for the stochastic portion). In some embodiments, load/rate predictor 412 makes load/rate predictions using the techniques described in U.S. patent application Ser. No. 14/717,593, titled "Building Management System for Forecasting Time Series Values of Building Variables" and filed May 20, 2015.

Load/rate predictor 412 may receive utility rates from utilities 320. Utility rates may indicate a cost or price per unit of a resource (e.g., electricity, natural gas, water, etc.) provided by utilities 320 at each time step k in the optimization window. In some embodiments, the utility rates are time-variable rates. For example, the price of electricity may be higher at certain times of day or days of the week (e.g., during high demand periods) and lower at other times of day or days of the week (e.g., during low demand periods). The utility rates may define various time periods and a cost per unit of a resource during each time period. Utility rates may be actual rates received from utilities 320 or predicted utility rates estimated by load/rate predictor 412.

In some embodiments, the utility rates include demand charges for one or more resources provided by utilities 320. A demand charge may define a separate cost imposed by utilities 320 based on the maximum usage of a particular resource (e.g., maximum energy consumption) during a demand charge period. The utility rates may define various demand charge periods and one or more demand charges associated with each demand charge period. In some instances, demand charge periods may overlap partially or completely with each other and/or with the prediction window. Advantageously, optimization controller 112 may be configured to account for demand charges in the high level optimization process performed by high level controller 306. Utilities 320 may be defined by time-variable (e.g., hourly) prices, a maximum service level (e.g., a maximum rate of consumption allowed by the physical infrastructure or by contract) and, in the case of electricity, a demand charge or a charge for the peak rate of consumption within a certain period. Load/rate predictor 412 may store the predicted campus power $\hat{P}_{campus}$ and the utility rates in memory 406 and/or provide the predicted campus power $\hat{P}_{campus}$ and the utility rates to high level controller 306 as needed.

Still referring to FIG. 4, the high level controller 306 is shown to include an energy market predictor 414 and a signal statistics predictor 416. Energy market predictor 414 may be configured to predict energy market statistics relating to the frequency response program. For example, energy market predictor 414 may predict the values of one or more variables that can be used to estimate frequency response revenue. In some embodiments, the frequency response revenue is defined by the following equation:

$$Rev = PS(CP_{cap} + MR \cdot CP_{perf})Reg_{award}$$

where Rev is the frequency response revenue, $CP_{cap}$ is the capability clearing price, MR is the mileage ratio, and $CP_{perf}$ is the performance clearing price. PS is a performance score based on how closely the frequency response provided by controller 112 tracks the regulation signal. Energy market predictor 414 may be configured to predict the capability clearing price $CP_{cap}$, the performance clearing price $CP_{perf}$, the mileage ratio MR, and/or other energy market statistics that can be used to estimate frequency response revenue. Energy market predictor 414 may store the energy market statistics in memory 406 and/or provide the energy market statistics to high level controller 306.

Signal statistics predictor 416 may be configured to predict one or more statistics of the regulation signal provided by incentive provider 114. For example, signal statistics predictor 416 may be configured to predict the mean $\mu_{FR}$, standard deviation $\sigma_{FR}$, and/or other statistics of the regulation signal. The regulation signal statistics may be based on previous values of the regulation signal (e.g., a historical mean, a historical standard deviation, etc.) or predicted values of the regulation signal (e.g., a predicted mean, a predicted standard deviation, etc.).

In some embodiments, signal statistics predictor 416 uses a deterministic plus stochastic model trained from historical regulation signal data to predict future values of the regulation signal. For example, signal statistics predictor 416 may use linear regression to predict a deterministic portion of the regulation signal and an AR model to predict a stochastic portion of the regulation signal. In some embodiments, signal statistics predictor 416 predicts the regulation signal using the techniques described in U.S. patent application Ser. No. 14/717,593, titled "Building Management System for Forecasting Time Series Values of Building Variables" and filed May 20, 2015. Signal statistics predictor 416 may use the predicted values of the regulation signal to calculate the regulation signal statistics. Signal statistics predictor 416 may store the regulation signal statistics in memory 406 and/or provide the regulation signal statistics to high level controller 306.

Constant State-of-Charge Controller

Constant SOC controller 408 may determine midpoint b by equating the desired power $P^*_{POI}$ at POI 110 with the actual power at POI 110 as shown in the following equation:

$$(Reg_{signal})(Reg_{award})+b=P_{bat}+P_{loss}+P_{campus}$$

where the left side of the equation $(Reg_{signal})$ $(Reg_{award})+b$ is the desired power $P^*_{POI}$ at POI 110 and the right side of the equation is the actual power at POI 110. Integrating over the frequency response period results in the following equation:

$$\int_{period} ((Reg_{signal})(Reg_{award}) + b)dt = \int_{period} (P_{bat} + P_{loss} + P_{campus})dt$$

Since the SOC of battery 108 is maintained at the same value at the beginning and end of the frequency response period, the integral of the battery power $P_{bat}$ over the frequency response period is zero (i.e., $\int P_{bat} dt=0$). Accordingly, the previous equation can be rewritten as follows:

$$b = \int_{period} P_{loss}dt + \int_{period} P_{campus}dt - Reg_{award}\int_{period} Reg_{signal}dt$$

where the term $\int P_{bat}$ dt has been omitted because $\int P_{bat}$ dt=0. This is ideal behavior if the only goal is to maximize frequency response revenue. Keeping the SOC of battery 108 at a constant value (and near 50%) will allow system 100 to participate in the frequency market during all hours of the day.

Constant SOC controller 408 may use the estimated values of the campus power signal received from campus 102 to predict the value of $\int P_{campus}$ dt over the frequency response period. Similarly, constant SOC controller 408 may use the estimated values of the regulation signal from incentive provider 114 to predict the value of $\int Reg_{signal}$ dt over the frequency response period. $Reg_{award}$ can be expressed as a function of midpoint b as previously described (e.g., $Reg_{award}=P_{limit}-|b|$). Therefore, the only remaining term in the equation for midpoint b is the expected battery power loss $\int P_{loss}$.

Constant SOC controller 408 is shown to include a battery power loss estimator 418. Battery power loss estimator 418 may estimate the value of $\int P_{loss}$ dt using a Thevinin equivalent circuit model of battery 108. For example, battery power loss estimator 418 may model battery 108 as a voltage source in series with a resistor. The voltage source has an open circuit voltage of $V_{OC}$ and the resistor has a resistance of $R_{TH}$. An electric current I flows from the voltage source through the resistor.

To find the battery power loss in terms of the supplied power $P_{sup}$, battery power loss estimator 418 may identify the supplied power $P_{sup}$ as a function of the current I, the open circuit voltage $V_{OC}$, and the resistance $R_{TH}$ as shown in the following equation:

$$P_{sup}=V_{OC}I-I^2 R_{TH}$$

which can be rewritten as:

$$\frac{I^2}{I_{SC}} - I + \frac{P'}{4} = 0$$

with the following substitutions:

$$I_{SC} = \frac{V_{OC}}{R_{TH}}, P' = \frac{P}{P_{max}}, P_{max} = \frac{V_{OC}^2}{4R_{TH}}$$

where P is the supplied power and $P_{max}$ is the maximum possible power transfer.

Battery power loss estimator 418 may solve for the current I as follows:

$$I = \frac{I_{SC}}{2}(1 - \sqrt{1-P'})$$

which can be converted into an expression for power loss $P_{loss}$ in terms of the supplied power P and the maximum possible power transfer $P_{max}$ as shown in the following equation:

$$P_{loss}=P_{max}(1-\sqrt{1-P'})^2$$

Battery power loss estimator 418 may simplify the previous equation by approximating the expression $(1-\sqrt{1-P'})$ as a linear function about P'=0. This results in the following approximation for $P_{loss}$:

$$P_{loss} \approx P_{max}\left(\frac{P'}{2}\right)^2$$

which is a good approximation for powers up to one-fifth of the maximum power.

Battery power loss estimator 418 may calculate the expected value of $\int P_{loss}$ dt over the frequency response period as follows:

$$\int_{period} P_{loss}dt = \int_{period} -P_{max}\left(\frac{Reg_{award}Reg_{signal} + b - P_{campus}}{2P_{max}}\right)^2 dt$$

$$= \frac{1}{4P_{max}}\Bigg[2Reg_{award}\int_{period} P_{campus}Reg_{signal}dt -$$

$$\int_{period} P_{campus}^2 dt -$$

$$Reg_{award}^2 \int_{period} Reg_{signal}^2 dt\Bigg] +$$

$$\frac{b}{2P_{max}}\Bigg[\int_{period} P_{campus}^2 dt -$$

$$Reg_{award}\int_{period} Reg_{signal}dt\Bigg] - \frac{b^2}{4P_{max}}\Delta t$$

$$= \frac{1}{4P_{max}}[E\{P_{campus}^2\} + Reg_{award}^2 E\{Reg_{signal}^2\} -$$

$$2Reg_{award}E\{Reg_{signal}\}E\{P_{campus}\}]\Delta t -$$

$$\frac{b}{2P_{max}}[Reg_{award}E\{Reg_{signal}\} - E\{P_{campus}\}]\Delta t -$$

$$\frac{b^2}{4P_{max}}\Delta t$$

where the notation E{ } indicates that the variable within the brackets { } is ergodic and can be approximated by the estimated mean of the variable. This formulation allows battery power loss estimator 418 to estimate ∫P$_{loss}$ dt as a function of other variables such as Reg$_{award}$, Reg$_{signal}$, P$_{campus}$, midpoint b, and P$_{max}$.

Constant SOC controller 408 is shown to include a midpoint calculator 420. Midpoint calculator 420 may be configured to calculate midpoint b by substituting the previous expression for ∫P$_{loss}$ dt into the equation for midpoint b. After substituting known and estimated values, the equation for midpoint b can be rewritten as follows:

$$\frac{1}{4P_{max}}\left[E\{P_{campus}^2\} + Reg_{award}^2 E\{Reg_{signal}^2\} - \right.$$
$$2Reg_{award}E\{Reg_{signal}\}E\{P_{campus}\}]\Delta t +$$
$$[Reg_{award}E\{Reg_{signal}\} - E\{P_{campus}\}]\Delta t +$$
$$\frac{b}{2P_{max}}[Reg_{award}E\{Reg_{signal}\} - E\{P_{campus}\}]\Delta t +$$
$$b\Delta t + \frac{b^2}{4P_{max}}\Delta t = 0$$

Midpoint calculator 420 may solve the equation for midpoint b to determine the midpoint b that maintains battery 108 at a constant state-of-charge.

Variable State-of-Charge Controller

Variable SOC controller 410 may determine optimal midpoints b by allowing the SOC of battery 108 to have different values at the beginning and end of a frequency response period. For embodiments in which the SOC of battery 108 is allowed to vary, the integral of the battery power P$_{bat}$ over the frequency response period can be expressed as $-\Delta SOC \cdot C_{des}$ as shown in the following equation:

$$\int_{period} P_{bat} dt = -\Delta SOC \cdot C_{des}$$

where $\Delta SOC$ is the change in the SOC of battery 108 over the frequency response period and $C_{des}$ is the design capacity of battery 108. The SOC of battery 108 may be a normalized variable (i.e., $0 \leq SOC \leq 1$) such that the term $SOC \cdot C_{des}$ represents the amount of energy stored in battery 108 for a given state-of-charge. The SOC is shown as a negative value because drawing energy from battery 108 (i.e., a positive P$_{bat}$) decreases the SOC of battery 108. The equation for midpoint b becomes:

$$b = \int_{period} P_{loss} dt + \int_{period} P_{campus} dt + \int_{period} P_{bat} dt - Reg_{award} \int_{period} Reg_{signal} dt$$

Variable SOC controller 410 is shown to include a battery power loss estimator 422 and a midpoint optimizer 424. Battery power loss estimator 422 may be the same or similar to battery power loss estimator 418. Midpoint optimizer 424 may be configured to establish a relationship between the midpoint b and the SOC of battery 108. For example, after substituting known and estimated values, the equation for midpoint b can be written as follows:

$$\frac{1}{4P_{max}}[E\{P_{campus}^2\} + Reg_{award}^2 +$$
$$E\{Reg_{signal}^2\} - 2Reg_{award}E\{Reg_{signal}\}E\{P_{campus}\}]\Delta t +$$
$$[Reg_{award}E\{Reg_{signal}\} + E\{P_{campus}\}]\Delta t + \Delta SOC \cdot C_{des} +$$
$$\frac{b}{2P_{max}}[Reg_{award}E\{Reg_{signal}\} - E\{P_{campus}\}]\Delta t + b\Delta t + \frac{b^2}{4P_{max}}\Delta t = 0$$

Advantageously, the previous equation defines a relationship between midpoint b and the change in SOC of battery 108. Midpoint optimizer 424 may use this equation to determine the impact that different values of midpoint b have on the SOC in order to determine optimal midpoints b. This equation can also be used by midpoint optimizer 424 during optimization to translate constraints on the SOC in terms of midpoint b. For example, the SOC of battery 108 may be constrained between zero and 1 (e.g., $0 \leq SOC \leq 1$) since battery 108 cannot be charged in excess of its maximum capacity or depleted below zero. Midpoint optimizer 424 may use the relationship between $\Delta SOC$ and midpoint b to constrain the optimization of midpoint b to midpoint values that satisfy the capacity constraint.

Midpoint optimizer 424 may perform an optimization to find optimal midpoints b for each frequency response period within the optimization window (e.g., each hour for the next day) given the electrical costs over the optimization window. Optimal midpoints b may be the midpoints that maximize an objective function that includes both frequency response revenue and costs of electricity and battery degradation. For example, an objective function J can be written as:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where Rev(Reg$_{award,k}$) is the frequency response revenue at time step k, $c_k b_k$ is the cost of electricity purchased at time step k, the min( ) term is the demand charge based on the maximum rate of electricity consumption during the applicable demand charge period, and $\lambda_{bat,k}$ is the monetized cost battery degradation at time step k. Midpoint optimizer 424 may use input from frequency response revenue estimator 428 (e.g., a revenue model) to determine a relationship between midpoint b and Rev(Reg$_{award,k}$). Similarly, midpoint optimizer 424 may use input from battery degradation estimator 430 and/or revenue loss estimator 432 to determine a relationship between midpoint b and the monetized cost of battery degradation $\lambda_{bat,k}$.

Still referring to FIG. 4, variable SOC controller 410 is shown to include an optimization constraints module 426. Optimization constraints module 426 may provide one or more constraints on the optimization performed by midpoint optimizer 424. The optimization constraints may be specified in terms of midpoint b or other variables that are related to midpoint b. For example, optimization constraints module 426 may implement an optimization constraint specifying that the expected SOC of battery 108 at the end of each frequency response period is between zero and one, as shown in the following equation:

$$0 \leq SOC_0 + \sum_{i=1}^{j} \Delta SOC_i \leq 1 \ \forall \ j = 1...h$$

where $SOC_0$ is the SOC of battery 108 at the beginning of the optimization window, $\Delta SOC_i$ is the change in SOC during frequency response period i, and h is the total number of frequency response periods within the optimization window.

In some embodiments, optimization constraints module 426 implements an optimization constraint on midpoint b so that the power at POI 110 does not exceed the power rating of power inverter 106. Such a constraint is shown in the following equation:

$$-P_{limit} \leq b_k + P_{campus,max}^{(p)} \leq P_{limit}$$

where $P_{limit}$ is the power rating of power inverter 106 and $P_{campus,max}^{(p)}$ is the maximum value of $P_{campus}$ at confidence level p. This constraint could also be implemented by identifying the probability that the sum of $b_k$ and $P_{campus,max}$ exceeds the power inverter power rating (e.g., using a probability density function for $P_{campus,max}$) and limiting that probability to less than or equal to 1−p.

In some embodiments, optimization constraints module 426 implements an optimization constraint to ensure (with a given probability) that the actual SOC of battery 108 remains between zero and one at each time step during the applicable frequency response period. This constraint is different from the first optimization constraint which placed bounds on the expected SOC of battery 108 at the end of each optimization period. The expected SOC of battery 108 can be determined deterministically, whereas the actual SOC of battery 108 is dependent on the campus power $P_{campus}$ and the actual value of the regulation signal $Reg_{signal}$ at each time step during the optimization period. In other words, for any value of $Reg_{award} > 0$, there is a chance that battery 108 becomes fully depleted or fully charged while maintaining the desired power $P^*_{POI}$ at POI 110.

Optimization constraints module 426 may implement the constraint on the actual SOC of battery 108 by approximating the battery power $P_{bat}$ (a random process) as a wide-sense stationary, correlated normally distributed process. Thus, the SOC of battery 108 can be considered as a random walk. Determining if the SOC would violate the constraint is an example of a gambler's ruin problem. For example, consider a random walk described by the following equation:

$$y_{k+1} = y_k + x_k, \ P(x_k=1)=p, \ P(x_k=-1)=1-p$$

The probability P that $y_k$ (starting at state z) will reach zero in less than n moves is given by the following equation:

$$P = 2a^{-1}(2p)^{\frac{n-z}{2}}[2(1-p)]^{\frac{n+z}{2}} \sum_{v=1}^{\frac{a}{2}} \cos^{n-1}\left(\frac{\pi v}{a}\right)\sin\left(\frac{\pi v}{a}\right)\sin\left(\frac{\pi z v}{a}\right)$$

In some embodiments, each frequency response period includes approximately n=1800 time steps (e.g., one time step every two seconds for an hour). Therefore, the central limit theorem applies and it is possible to convert the autocorrelated random process for $P_{bat}$ and the limits on the SOC of battery 108 into an uncorrelated random process of 1 or −1 with a limit of zero.

In some embodiments, optimization constraints module 426 converts the battery power $P_{bat}$ into an uncorrelated normal process driven by the regulation signal $Reg_{signal}$. For example, consider the original battery power described by the following equation:

$$x_{k+1} = \alpha x_k + e_k, \ x_k \sim N(\mu, \sigma), \ e_k \sim N(\mu_e, \sigma_e)$$

where the signal x represents the battery power $P_{bat}$, $\alpha$ is an autocorrelation parameter, and e is a driving signal. In some embodiments, e represents the regulation signal $Reg_{signal}$. If the power of the signal x is known, then the power of signal e is also known, as shown in the following equations:

$$\mu(1-\alpha) = \mu_e$$

$$E\{x_k^2\}(1-\alpha)^2 - 2\alpha\mu\mu_e = E\{e_k^2\}$$

$$E\{x_k^2\}(1-\alpha^2) - 2\mu^2\alpha(1-\alpha) = E\{e_k^2\},$$

Additionally, the impulse response of the difference equation for $x_{k+1}$ is:

$$h_k = \alpha^k \ k \geq 0$$

Using convolution, $x_k$ can be expressed as follows:

$$x_k = \sum_{i=1}^{k} \alpha^{k-i} e_{i-1}$$

$$x_3 = \alpha^2 e_0 + \alpha^1 e_1 + e_2$$

$$x_q = \alpha^{q-1} e_0 + \alpha^{q-2} e_1 + \ldots + \alpha e_{q-2} + e_{q-1}$$

A random walk driven by signal $x_k$ can be defined as follows:

$$y_k = \sum_{j=1}^{k} x_j = \sum_{j=1}^{k} \sum_{i=1}^{j} \alpha^{j-1} e_{i-1}$$

which for large values of j can be approximated using the infinite sum of a geometric series in terms of the uncorrelated signal e rather than x:

$$y_k = \sum_{j=1}^{k} x_j \approx \sum_{j=1}^{k} \frac{1}{1-\alpha} e_j = \sum_{j=1}^{k} x'_j \ k \gg 1$$

Thus, the autocorrelated driving signal $x_k$ of the random walk can be converted into an uncorrelated driving signal $x'_k$ with mean and power given by:

$$E\{x'_k\} = \mu, \ E\{(x'_k - \mu)^2\} = \frac{1+\alpha}{1-\alpha}\sigma^2,$$

$$E\{x'^2_k\} = \frac{1+\alpha}{1-\alpha}\sigma^2 + \mu^2, \ \sigma^2_{x'} = \frac{1+\alpha}{1-\alpha}\sigma^2$$

where $x'_k$ represents the regulation signal $Reg_{signal}$. Advantageously, this allows optimization constraints module 426 to define the probability of ruin in terms of the regulation signal $Reg_{signal}$.

In some embodiments, optimization constraints module 426 determines a probability p that the random walk driven by the sequence of −1 and 1 will take the value of 1. In order to ensure that the random walk driven by the sequence of −1 and 1 will behave the same as the random walk driven by $x'_k$, optimization constraints module 426 may select p such that the ratio of the mean to the standard deviation is the same for both driving functions, as shown in the following equations:

$$\frac{\text{mean}}{\text{stdev}} = \frac{\mu}{\sqrt{\frac{1+\alpha}{1-\alpha}}\sigma} = \tilde{\mu} = \frac{2p-1}{\sqrt{4p(1-p)}}$$

$$p = \frac{1}{2} \pm \frac{1}{2}\sqrt{1 - \left(\frac{1}{\tilde{\mu}^2+1}\right)}$$

where $\tilde{\mu}$ is the ratio of the mean to the standard deviation of the driving signal (e.g., $\text{Reg}_{signal}$) and $\mu$ is the change in state-of-charge over the frequency response period divided by the number of time steps within the frequency response period $$\left(\text{i.e., } \mu = \frac{\Delta SOC}{n}\right).$$

For embodiments in which each frequency response period has a duration of one hour (i.e., 3600 seconds) and the interval between time steps is two seconds, the number of time steps per frequency response period is 1800 (i.e., n=1800). In the equation for p, the plus is used when $\tilde{\mu}$ is greater than zero, whereas the minus is used when $\tilde{\mu}$ is less than zero. Optimization constraints module 426 may also ensure that both driving functions have the same number of standard deviations away from zero (or ruin) to ensure that both random walks have the same behavior, as shown in the following equation:

$$z = \frac{SOC \cdot C_{des}\sqrt{4p(1-p)}}{\sqrt{\frac{1+\alpha}{1-\alpha}}\sigma}$$

Advantageously, the equations for p and z allow optimization constraints module 426 to define the probability of ruin P (i.e., the probability of battery 108 fully depleting or reaching a fully charged state) within N time steps (n=1 . . . N) as a function of variables that are known to high level controller 306 and/or manipulated by high level controller 306. For example, the equation for p defines p as a function of the mean and standard deviation of the regulation signal $\text{Reg}_{signal}$, which may be estimated by signal statistics predictor 416. The equation for z defines z as a function of the SOC of battery 108 and the parameters of the regulation signal $\text{Reg}_{signal}$.

Optimization constraints module 426 may use one or more of the previous equations to place constraints on $\Delta SOC \cdot C_{des}$ and $\text{Reg}_{award}$ given the current SOC of battery 108. For example, optimization constraints module 426 may use the mean and standard deviation of the regulation signal $\text{Reg}_{signal}$ to calculate p. Optimization constraints module 426 may then use p in combination with the SOC of battery 108 to calculate z. Optimization constraints module 426 may use p and z as inputs to the equation for the probability of ruin P. This allows optimization constraints module 426 to define the probability or ruin P as a function of the SOC of battery 108 and the estimated statistics of the regulation signal $\text{Reg}_{signal}$. Optimization constraints module 426 may impose constraints on the SOC of battery 108 to ensure that the probability of ruin P within N time steps does not exceed a threshold value. These constraints may be expressed as limitations on the variables $\Delta SOC \cdot C_{des}$ and/or $\text{Reg}_{award}$, which are related to midpoint b as previously described.

In some embodiments, optimization constraints module 426 uses the equation for the probability of ruin P to define boundaries on the combination of variables p and z. The boundaries represent thresholds when the probability of ruin P in less than N steps is greater than a critical value $P_{cr}$ (e.g., $P_{cr}$=0.001). For example, optimization constraints module 426 may generate boundaries that correspond to a threshold probability of battery 108 fully depleting or reaching a fully charged state during a frequency response period (e.g., in N=1800 steps).

In some embodiments, optimization constraints module 426 constrains the probability of ruin P to less than the threshold value, which imposes limits on potential combinations of the variables p and z. Since the variables p and z are related to the SOC of battery 108 and the statistics of the regulation signal, the constraints may impose limitations on $\Delta SOC \cdot C_{des}$ and $\text{Reg}_{award}$ given the current SOC of battery 108. These constraints may also impose limitations on midpoint b since the variables $\Delta SOC \cdot C_{des}$ and $\text{Reg}_{award}$ are related to midpoint b. For example, optimization constraints module 426 may set constraints on the maximum bid $\text{Reg}_{award}$ given a desired change in the SOC for battery 108. In other embodiments, optimization constraints module 426 penalizes the objective function J given the bid $\text{Reg}_{award}$ and the change in SOC.

Still referring to FIG. 4, variable SOC controller 410 is shown to include a frequency response (FR) revenue estimator 428. FR revenue estimator 428 may be configured to estimate the frequency response revenue that will result from a given midpoint b (e.g., a midpoint provided by midpoint optimizer 424). The estimated frequency response revenue may be used as the term $\text{Rev}(\text{Reg}_{award,k})$ in the objective function J. Midpoint optimizer 424 may use the estimated frequency response revenue along with other terms in the objective function J to determine an optimal midpoint b.

In some embodiments, FR revenue estimator 428 uses a revenue model to predict frequency response revenue. An exemplary revenue model which may be used by FR revenue estimator 428 is shown in the following equation:

$$\text{Rev}(\text{Reg}_{award}) = \text{Reg}_{award}(CP_{cap} + MR \cdot CP_{perf})$$

where $CP_{cap}$, MR, and $CP_{perf}$ are the energy market statistics received from energy market predictor 414 and $\text{Reg}_{award}$ is a function of the midpoint b. For example, capability bid calculator 434 may calculate $\text{Reg}_{award}$ using the following equation:

$$\text{Reg}_{award} = P_{limit} - |b|$$

where $P_{limit}$ is the power rating of power inverter 106.

As shown above, the equation for frequency response revenue used by FR revenue estimator 428 does not include a performance score (or assumes a performance score of 1.0). This results in FR revenue estimator 428 estimating a maximum possible frequency response revenue that can be achieved for a given midpoint b (i.e., if the actual frequency response of controller 112 were to follow the regulation signal exactly). However, it is contemplated that the actual frequency response may be adjusted by low level controller 308 in order to preserve the life of battery 108. When the actual frequency response differs from the regulation signal, the equation for frequency response revenue can be adjusted to include a performance score. The resulting value function J may then be optimized by low level controller 308 to determine an optimal frequency response output which considers both frequency response revenue and the costs of battery degradation, as described with reference to FIG. 5.

Still referring to FIG. 4, variable SOC controller 410 is shown to include a battery degradation estimator 430. Battery degradation estimator 430 may estimate the cost of battery degradation that will result from a given midpoint b (e.g., a midpoint provided by midpoint optimizer 424). The estimated battery degradation may be used as the term $\lambda_{bat}$ in the objective function J. Midpoint optimizer 424 may use the estimated battery degradation along with other terms in the objective function J to determine an optimal midpoint b.

In some embodiments, battery degradation estimator 430 uses a battery life model to predict a loss in battery capacity that will result from a set of midpoints b, power outputs, and/or other variables that can be manipulated by high level controller 306. The battery life model may define the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$\left(\text{e.g., } PR = avg\left(\frac{P_{avg}}{P_{des}}\right)\right),$$

and ER is the average effort ratio (e.g., $$ER = avg\left(\frac{\Delta P_{bat}}{P_{des}}\right)$$

of battery 108. $C_{loss,nom}$ is the nominal loss in battery capacity that is expected to occur over time. Therefore, $C_{loss,add}$ represents the additional loss in battery capacity degradation in excess of the nominal value $C_{loss,nom}$.

Battery degradation estimator 430 may define the terms in the battery life model as functions of one or more variables that have known values (e.g., estimated or measured values) and/or variables that can be manipulated by high level controller 306. For example, battery degradation estimator 430 may define the terms in the battery life model as functions of the regulation signal statistics (e.g., the mean and standard deviation of $Reg_{signal}$), the campus power signal statistics (e.g., the mean and standard deviation of $P_{campus}$), $Reg_{award}$, midpoint b, the SOC of battery 108, and/or other variables that have known or controlled values.

In some embodiments, battery degradation estimator 430 measures the cell temperature $T_{cell}$ using a temperature sensor configured to measure the temperature of battery 108. In other embodiments, battery degradation estimator 430 estimates or predicts the cell temperature $T_{cell}$ based on a history of measured temperature values. For example, battery degradation estimator 430 may use a predictive model to estimate the cell temperature $T_{cell}$ as a function of the battery power $P_{bat}$, the ambient temperature, and/or other variables that can be measured, estimated, or controlled by high level controller 306.

Battery degradation estimator 430 may define the variable SOC in the battery life model as the SOC of battery 108 at the end of the frequency response period. The SOC of battery 108 may be measured or estimated based on the control decisions made by high level controller 306. For example, battery degradation estimator 430 may use a predictive model to estimate or predict the SOC of battery 108 at the end of the frequency response period as a function of the battery power $P_{bat}$, the midpoint b, and/or other variables that can be measured, estimated, or controlled by high level controller 306.

Battery degradation estimator 430 may define the average power ratio PR as the ratio of the average power output of battery 108 (i.e., $P_{avg}$) to the design power $P_{des}$ $$\left(\text{e.g., } PR = \frac{P_{avg}}{P_{des}}\right).$$

The average power output of battery 108 can be defined using the following equation:

$$P_{avg} = E\{|Reg_{award}Reg_{signal} + b - P_{loss} - P_{campus}|\}$$

where the expression ($Reg_{award}Reg_{signal} + b - P_{loss} - P_{campus}$) represents the battery power $P_{bat}$. The expected value of $P_{avg}$ is given by:

$$P_{avg} = \sigma_{bat}\sqrt{\frac{2}{\pi}}\exp\left(\frac{-\mu_{bat}^2}{2\sigma_{bat}^2}\right) + \text{erf}\left(\frac{-\mu_{bat}}{\sqrt{2\sigma_{bat}^2}}\right)$$

where $\mu_{bat}$ and $\sigma_{bat}^2$ are the mean and variance of the battery power $P_{bat}$. The variables $\mu_{bat}$ and $\sigma_{bat}^2$ may be defined as follows:

$$\mu_{bat} = Reg_{award}E\{Reg_{signal}\} + b - E\{P_{loss}\} - E\{P_{campus}\}$$

$$\sigma_{bat}^2 = Reg_{award}^2\sigma_{FR}^2 + \sigma_{campus}^2$$

where $\sigma_{FR}^2$ is the variance of $Reg_{signal}$ and the contribution of the battery power loss to the variance $\sigma_{bat}^2$ is neglected.

Battery degradation estimator 430 may define the average effort ratio ER as the ratio of the average change in battery power $\Delta P_{avg}$ to the design power $P_{des}$ $$\left(\text{i.e., } ER = \frac{\Delta P_{avg}}{P_{des}}\right).$$

The average change in battery power can be defined using the following equation:

$$\Delta P_{avg} = E\{P_{bat,k} - P_{bat,k-1}\}$$

$$\Delta P_{avg} = E\{|Reg_{award}(Reg_{signal,k} - Reg_{signal,k-1}) - (P_{loss,k} - P_{loss,k-1}) - (P_{campus,k} - P_{campus,k-1})|\}$$

To make this calculation more tractable, the contribution due to the battery power loss can be neglected. Additionally, the campus power $P_{campus}$ and the regulation signal $Reg_{signal}$ can be assumed to be uncorrelated, but autocorrelated with first order autocorrelation parameters of $\alpha_{campus}$ and $\alpha$, respectively. The argument inside the absolute value in the equation for $\Delta P_{avg}$ has a mean of zero and a variance given by:

$$\sigma_{diff}^2 = E\{[Reg_{award}(Reg_{signal,k} - Reg_{signal,k-1}) - (P_{campus,k} - P_{campus,k-1})]^2\}$$

$$= E\{[Reg_{award}^2(Reg_{signal,k} - Reg_{signal,k-1})^2 - (P_{campus,k} - P_{campus,k-1})^2\}$$

$$= 2Reg_{award}^2(1-\alpha)\sigma_{FR}^2 + 2(1-\alpha_{campus})\sigma_{campus}^2$$

Battery degradation estimator 430 may define the depth of discharge DOD as the maximum state-of-charge minus the minimum state-of-charge of battery 108 over the frequency response period, as shown in the following equation:

$$DOD = SOC_{max} - SOC_{min}$$

The SOC of battery 108 can be viewed as a constant slope with a zero mean random walk added to it, as previously described. An uncorrelated normal random walk with a driving signal that has zero mean has an expected range given by:

$$E\{max - min\} = 2\sigma\sqrt{\frac{2N}{\pi}}$$

where E{max−min} represent the depth of discharge DOD and can be adjusted for the autocorrelation of the driving signal as follows:

$$E\{max - min\} = 2\sigma_{bat}\sqrt{\frac{1+\alpha_{bat}}{1-\alpha_{bat}}}\sqrt{\frac{2N}{\pi}}$$

$$\sigma_{bat}^2 = Reg_{award}^2 \sigma_{FR}^2 + \sigma_{campus}^2$$

$$\alpha_{bat} = \frac{Reg_{award}^2 \alpha \sigma_{FR}^2 + \alpha_{campus}\sigma_{campus}^2}{Reg_{award}^2 \sigma_{FR}^2 + \sigma_{campus}^2}$$

If the SOC of battery 108 is expected to change (i.e., is not zero mean), the following equation may be used to define the depth of discharge:

$$E\{max - min\} = \begin{cases} R_0 + c \cdot \Delta SOC \cdot \exp\left\{-\alpha\frac{R_0 - \Delta SOC}{\sigma_{bat}}\right\} & \Delta SOC < R_0 \\ \Delta SOC + c \cdot R_0 \cdot \exp\left\{-\alpha\frac{\Delta SOC - R_0}{\sigma_{bat}}\right\} & \Delta SOC > R_0 \end{cases}$$

where $R_0$ is the expected range with zero expected change in the state-of-charge. Battery degradation estimator 430 may use the previous equations to establish a relationship between the capacity loss $C_{loss,add}$ and the control outputs provided by high level controller 306.

Still referring to FIG. 4, variable SOC controller 410 is shown to include a revenue loss estimator 432. Revenue loss estimator 432 may be configured to estimate an amount of potential revenue that will be lost as a result of the battery capacity loss $C_{loss,add}$. In some embodiments, revenue loss estimator 432 converts battery capacity loss $C_{loss,add}$ into lost revenue using the following equation:

$$R_{loss} = (CP_{cap} + MR \cdot CP_{perf})C_{loss,add}P_{des}$$

where $R_{loss}$ is the lost revenue over the duration of the frequency response period.

Revenue loss estimator 432 may determine a present value of the revenue loss $R_{loss}$ using the following equation:

$$\lambda_{bat} = \left[\frac{1-\left(1+\frac{i}{n}\right)^{-n}}{\frac{i}{n}}\right]R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 432 may provide the present value of the revenue loss $\lambda_{bat}$ to midpoint optimizer 424 for use in the objective function J.

Midpoint optimizer 424 may use the inputs from optimization constraints module 426, FR revenue estimator 428, battery degradation estimator 430, and revenue loss estimator 432 to define the terms in objective function J. Midpoint optimizer 424 may determine values for midpoint b that optimize objective function J. In various embodiments, midpoint optimizer 424 may use sequential quadratic programming, dynamic programming, or any other optimization technique.

Still referring to FIG. 4, high level controller 306 is shown to include a capability bid calculator 434. Capability bid calculator 434 may be configured to generate a capability bid $Reg_{award}$ based on the midpoint b generated by constant SOC controller 408 and/or variable SOC controller 410. In some embodiments, capability bid calculator 434 generates a capability bid that is as large as possible for a given midpoint, as shown in the following equation:

$$Reg_{award} = P_{limit} - |b|$$

where $P_{limit}$ is the power rating of power inverter 106. Capability bid calculator 434 may provide the capability bid to incentive provider 114 and to frequency response optimizer 436 for use in generating an optimal frequency response.

Filter Parameters Optimization

Still referring to FIG. 4, high level controller 306 is shown to include a frequency response optimizer 436 and a filter parameters optimizer 438. Filter parameters optimizer 438 may be configured to generate a set of filter parameters for low level controller 308. The filter parameters may be used by low level controller 308 as part of a low-pass filter that removes high frequency components from the regulation signal $Reg_{signal}$. In some embodiments, filter parameters optimizer 438 generates a set of filter parameters that transform the regulation signal $Reg_{signal}$ into an optimal frequency response signal $Res_{FR}$. Frequency response optimizer 436 may perform a second optimization process to determine the optimal frequency response $Res_{FR}$ based on the values for $Reg_{award}$ and midpoint b. In the second optimization, the values for $Reg_{award}$ and midpoint b may be fixed at the values previously determined during the first optimization.

In some embodiments, frequency response optimizer 436 determines the optimal frequency response $Res_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response revenue $Rev(Reg_{award})$ is defined as follows:

$$Rev(Reg_{award}) = PS \cdot Reg_{award}(CP_{cap} + MR \cdot CP_{perf})$$

and the frequency response $Res_{FR}$ is substituted for the regulation signal $Reg_{signal}$ in the battery life model used to calculate $\lambda_{bat,k}$. The performance score PS may be based on several factors that indicate how well the optimal frequency response $Res_{FR}$ tracks the regulation signal $Reg_{signal}$.

The frequency response $Res_{FR}$ may affect both $Rev(Reg_{award})$ and the monetized cost of battery degradation $\lambda_{bat}$. Closely tracking the regulation signal may result in higher performance scores, thereby increasing the frequency response revenue. However, closely tracking the regulation signal may also increase the cost of battery degradation $\lambda_{bat}$. The optimized frequency response $Res_{FR}$ represents an optimal tradeoff between decreased frequency response revenue and increased battery life (i.e., the frequency response that maximizes value J).

In some embodiments, the performance score PS is a composite weighting of an accuracy score, a delay score, and a precision score. Frequency response optimizer 436 may calculate the performance score PS using the performance score model shown in the following equation:

$$PS = \tfrac{1}{3} PS_{acc} + \tfrac{1}{3} PS_{delay} + \tfrac{1}{3} PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others.

The accuracy score $PS_{acc}$ may be the maximum correlation between the regulation signal Re and the optimal frequency response $Res_{FR}$. Frequency response optimizer 436 may calculate the accuracy score $PS_{acc}$ using the following equation:

$$PS_{acc} = \max_{\delta} r_{Reg, Res(\delta)}$$

where δ is a time delay between zero and $\delta_{max}$ (e.g., between zero and five minutes).

The delay score $PS_{delay}$ may be based on the time delay δ between the regulation signal $Reg_{signal}$ and the optimal frequency response $Res_{FR}$. Frequency response optimizer 436 may calculate the delay score $PS_{delay}$ using the following equation:

$$PS_{delay} = \left| \frac{\delta[s] - \delta_{max}}{\delta_{max}} \right|$$

where δ[s] is the time delay of the frequency response $Res_{FR}$ relative to the regulation signal $Reg_{signal}$ and $\delta_{max}$ is the maximum allowable delay (e.g., 5 minutes or 300 seconds).

The precision score $PS_{prec}$ may be based on a difference between the frequency response $Res_{FR}$ and the regulation signal $Reg_{signal}$. Frequency response optimizer 436 may calculate the precision score $PS_{prec}$ using the following equation:

$$PS_{prec} = 1 - \frac{\sum |Res_{FR} - Reg_{signal}|}{\sum |Reg_{signal}|}$$

Frequency response optimizer 436 may use the estimated performance score and the estimated battery degradation to define the terms in objective function J. Frequency response optimizer 436 may determine values for frequency response $Res_{FR}$ that optimize objective function J. In various embodiments, frequency response optimizer 436 may use sequential quadratic programming, dynamic programming, or any other optimization technique.

Filter parameters optimizer 438 may use the optimized frequency response $Res_{FR}$ to generate a set of filter parameters for low level controller 308. In some embodiments, the filter parameters are used by low level controller 308 to translate an incoming regulation signal into a frequency response signal. Low level controller 308 is described in greater detail with reference to FIG. 5.

Low Level Controller

Figure 5:
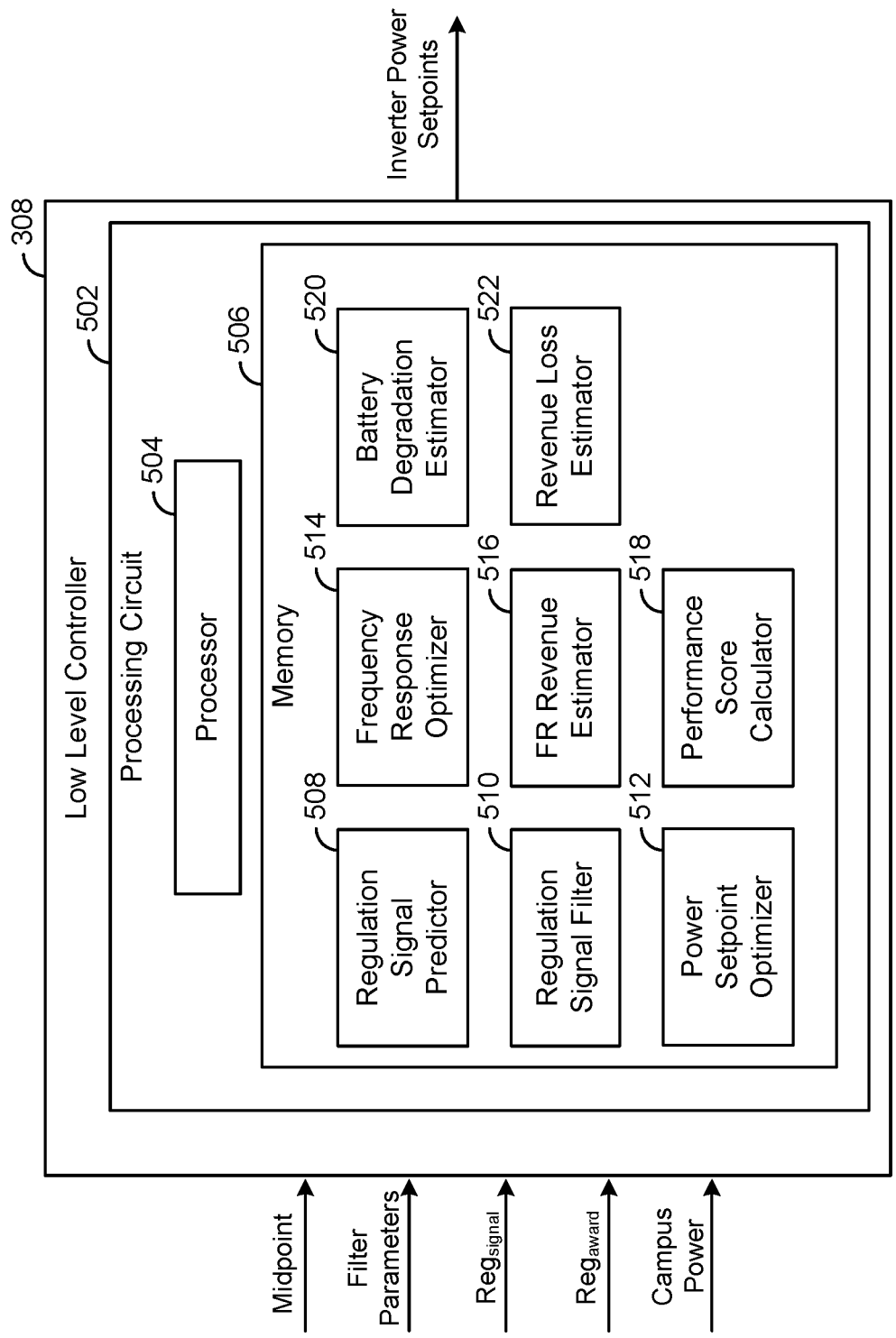
FIG. 5 is a block diagram illustrating the low level controller of FIG. 3 in greater detail, according to some embodiments.

Referring now to FIG. 5, a block diagram illustrating low level controller 308 in greater detail is shown, according to an exemplary embodiment. Low level controller 308 may receive the midpoints b and the filter parameters from high level controller 306. Low level controller 308 may also receive the campus power signal from campus 102 and the regulation signal $Reg_{signal}$ and the regulation award $Reg_{award}$ from incentive provider 114. Low level controller 308 is shown to include a processing circuit 502. The processing circuit 502 is shown to include a processor 504 and memory 506. Processor 504 may be a general purpose or specific purpose processor, an application specific integrated circuit (ASIC), one or more field programmable gate arrays (FPGAs), a group of processing components, or other suitable processing components. Processor 404 may be configured to execute computer code or instructions stored in memory 506 or received from other computer readable media (e.g., CDROM, network storage, a remote server, etc.).

Memory 506 may include one or more devices (e.g., memory units, memory devices, storage devices, etc.) for storing data and/or computer code for completing and/or facilitating the various processes described in the present disclosure. Memory 506 may include random access memory (RAM), read-only memory (ROM), hard drive storage, temporary storage, non-volatile memory, flash memory, optical memory, or any other suitable memory for storing software objects and/or computer instructions. Memory 506 may include database components, object code components, script components, or any other type of information structure for supporting the various activities and information structures described in the present disclosure. Memory 506 may be communicably connected to processor 504 via processing circuit 502 and may include computer code for executing (e.g., by processor 504) one or more processes described herein.

Predicting and Filtering the Regulation Signal

Low level controller 308 is shown to include a regulation signal predictor 508. Regulation signal predictor 508 may use a history of past and current values for the regulation signal $Reg_{signal}$ to predict future values of the regulation signal. In some embodiments, regulation signal predictor 508 uses a deterministic plus stochastic model trained from historical regulation signal data to predict future values of the regulation signal $Reg_{signal}$. For example, regulation signal predictor 508 may use linear regression to predict a deterministic portion of the regulation signal $Reg_{signal}$ and an AR model to predict a stochastic portion of the regulation signal $Reg_{signal}$. In some embodiments, regulation signal predictor 508 predicts the regulation signal $Reg_{signal}$ using the techniques described in U.S. patent application Ser. No. 14/717,593, titled "Building Management System for Forecasting Time Series Values of Building Variables" and filed May 20, 2015.

Low level controller 308 is shown to include a regulation signal filter 510. Regulation signal filter 510 may filter the incoming regulation signal $Reg_{signal}$ and/or the predicted regulation signal using the filter parameters provided by high level controller 306. In some embodiments, regulation signal filter 510 is a low pass filter configured to remove high frequency components from the regulation signal $Reg_{signal}$. Regulation signal filter 510 may provide the filtered regulation signal to power setpoint optimizer 512.

Determining Optimal Power Setpoints

Power setpoint optimizer 512 may be configured to determine optimal power setpoints for power inverter 106 based on the filtered regulation signal. In some embodiments, power setpoint optimizer 512 uses the filtered regulation signal as the optimal frequency response. For example, low level controller 308 may use the filtered regulation signal to calculate the desired interconnection power $P^*_{POI}$ using the following equation:

$$P^*_{POI} = Reg_{award} \cdot Reg_{filter} + b$$

where $Reg_{filter}$ is the filtered regulation signal. Power setpoint optimizer 512 may subtract the campus power $P_{campus}$ from the desired interconnection power $P^*_{POI}$ to calculate the optimal power setpoints $P_{SP}$ for power inverter 106, as shown in the following equation:

$$P_{SP} = P^*_{POI} - P_{campus}$$

In other embodiments, low level controller 308 performs an optimization to determine how closely to track $P^*_{POI}$. For example, low level controller 308 is shown to include a frequency response optimizer 514. Frequency response optimizer 514 may determine an optimal frequency response $Res_{FR}$ by optimizing value function J shown in the following equation:

$$J = \sum_{k=1}^{h} Rev(Reg_{award,k}) + \sum_{k=1}^{h} c_k b_k + \min_{period}(P_{campus,k} + b_k) - \sum_{k=1}^{h} \lambda_{bat,k}$$

where the frequency response $Res_{FR}$ affects both $Rev(Reg_{award})$ and the monetized cost of battery degradation $\lambda_{bat}$. The frequency response $Res_{FR}$ may affect both $Rev(Reg_{award})$ and the monetized cost of battery degradation $\lambda_{bat}$. The optimized frequency response $Res_{FR}$ represents an optimal tradeoff between decreased frequency response revenue and increased battery life (i.e., the frequency response that maximizes value J). The values of $Rev(Reg_{award})$ and $\lambda_{bat,k}$ may be calculated by FR revenue estimator 516, performance score calculator 518, battery degradation estimator 520, and revenue loss estimator 522.

Estimating Frequency Response Revenue

Still referring to FIG. 5, low level controller 308 is shown to include a FR revenue estimator 516. FR revenue estimator 516 may estimate a frequency response revenue that will result from the frequency response $Res_{FR}$. In some embodiments, FR revenue estimator 516 estimates the frequency response revenue using the following equation:

$$Rev(Reg_{award}) = PS \cdot Reg_{award}(CP_{cap} + MR \cdot CP_{perf})$$

where $Reg_{award}$, $CP_{cap}$, MR, and $CP_{perf}$ are provided as known inputs and PS is the performance score.

Low level controller 308 is shown to include a performance score calculator 518. Performance score calculator 518 may calculate the performance score PS used in the revenue function. The performance score PS may be based on several factors that indicate how well the optimal frequency response $Res_{FR}$ tracks the regulation signal $Reg_{signal}$. In some embodiments, the performance score PS is a composite weighting of an accuracy score, a delay score, and a precision score. Performance score calculator 518 may calculate the performance score PS using the performance score model shown in the following equation:

$$PS = \tfrac{1}{3} PS_{acc} + \tfrac{1}{3} PS_{delay} + \tfrac{1}{3} PS_{prec}$$

where $PS_{acc}$ is the accuracy score, $PS_{delay}$ is the delay score, and $PS_{prec}$ is the precision score. In some embodiments, each term in the precision score is assigned an equal weighting (e.g., ⅓). In other embodiments, some terms may be weighted higher than others. Each of the terms in the performance score model may be calculated as previously described with reference to FIG. 4.

Estimating Battery Degradation

Still referring to FIG. 5, low level controller 308 is shown to include a battery degradation estimator 520. Battery degradation estimator 520 may be the same or similar to battery degradation estimator 430, with the exception that battery degradation estimator 520 predicts the battery degradation that will result from the frequency response $Res_{FR}$ rather than the original regulation signal $Reg_{signal}$. The estimated battery degradation may be used as the term $\lambda_{batt}$ in the objective function J. Frequency response optimizer 514 may use the estimated battery degradation along with other terms in the objective function J to determine an optimal frequency response $Res_{FR}$.

In some embodiments, battery degradation estimator 520 uses a battery life model to predict a loss in battery capacity that will result from the frequency response $Res_{FR}$. The battery life model may define the loss in battery capacity $C_{loss,add}$ as a sum of multiple piecewise linear functions, as shown in the following equation:

$$C_{loss,add} = f_1(T_{cell}) + f_2(SOC) + f_3(DOD) + f_4(PR) + f_5(ER) - C_{loss,nom}$$

where $T_{cell}$ is the cell temperature, SOC is the state-of-charge, DOD is the depth of discharge, PR is the average power ratio $$\left( \text{e.g., } PR = avg\left(\frac{P_{avg}}{P_{des}}\right) \right),$$

and ER is the average effort ratio (e.g., $$ER = avg\left(\frac{\Delta P_{bat}}{P_{des}}\right)$$

of battery 108. $C_{loss,nom}$ is the nominal loss in battery capacity that is expected to occur over time. Therefore, $C_{loss,add}$ represents the additional loss in battery capacity degradation in excess of the nominal value $C_{loss,nom}$. The terms in the battery life model may be calculated as described with reference to FIG. 4, with the exception that the frequency response $Res_{FR}$ is used in place of the regulation signal $Reg_{signal}$.

Still referring to FIG. 5, low level controller 308 is shown to include a revenue loss estimator 522. Revenue loss estimator 522 may be the same or similar to revenue loss estimator 432, as described with reference to FIG. 4. For example, revenue loss estimator 522 may be configured to estimate an amount of potential revenue that will be lost as a result of the battery capacity loss $C_{loss,add}$. In some embodiments, revenue loss estimator 522 converts battery capacity loss $C_{loss,add}$ into lost revenue using the following equation:

$$R_{loss} = (CP_{cap} + MR \cdot CP_{perf}) C_{loss,add} P_{des}$$

where $R_{loss}$ is the lost revenue over the duration of the frequency response period.

Revenue loss estimator 522 may determine a present value of the revenue loss $R_{loss}$ using the following equation:

$$\lambda_{bat} = \left[ \frac{1 - \left(1 + \frac{i}{n}\right)^{-n}}{\frac{i}{n}} \right] R_{loss}$$

where n is the total number of frequency response periods (e.g., hours) during which the revenue loss occurs and $\lambda_{bat}$ is the present value of the revenue loss during the ith frequency response period. In some embodiments, the revenue loss occurs over ten years (e.g., n=87,600 hours). Revenue loss estimator 522 may provide the present value of the revenue loss $\lambda_{bat}$ to frequency response optimizer 514 for use in the objective function J.

Frequency response optimizer 514 may use the estimated performance score and the estimated battery degradation to define the terms in objective function J. Frequency response optimizer 514 may determine values for frequency response $Res_{FR}$ that optimize objective function J. In various embodiments, frequency response optimizer 514 may use sequential quadratic programming, dynamic programming, or any other optimization technique.

Communication Structure of Optimization Controller

Figure 6:
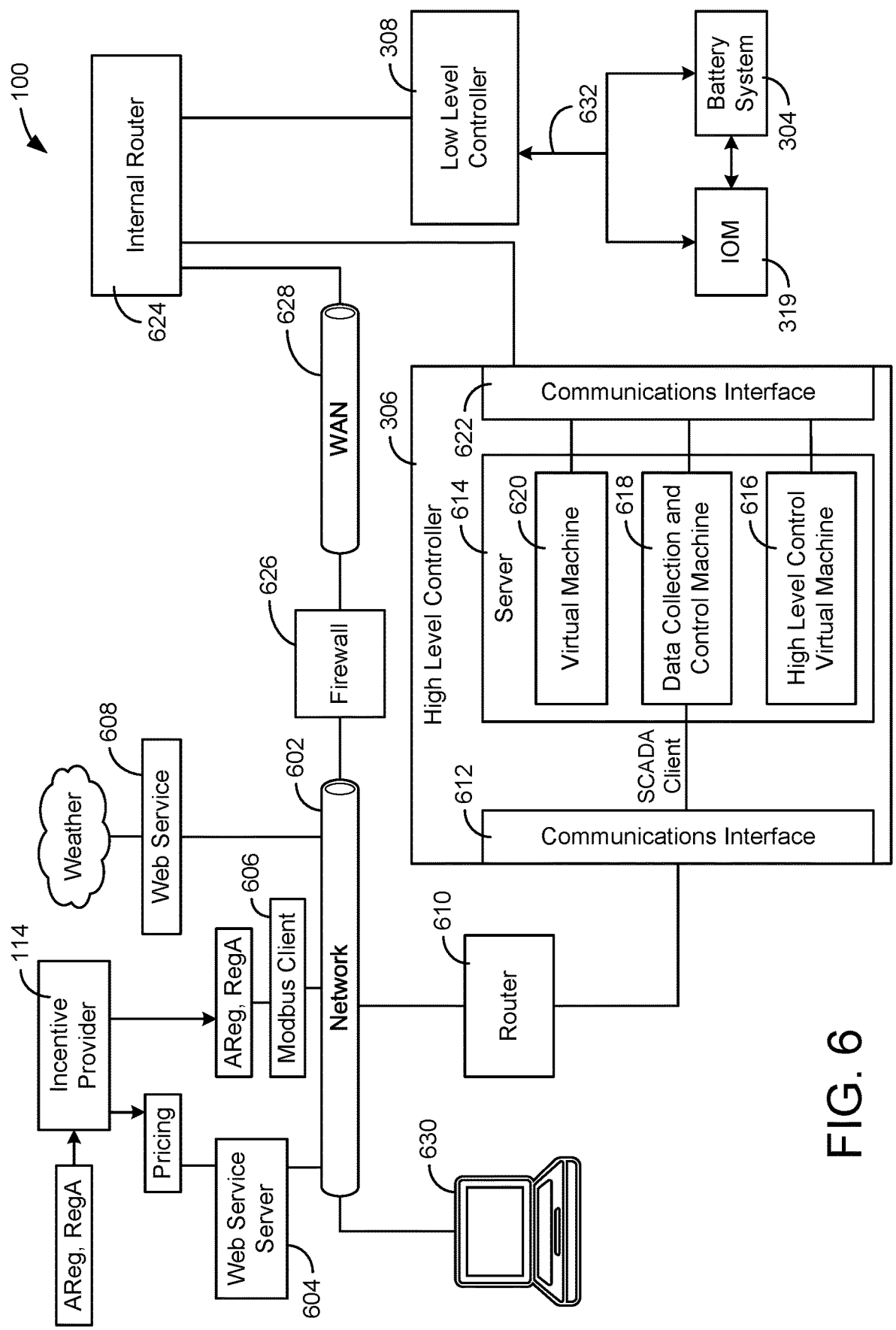
FIG. 6 is a system view of the system of FIG. 1, in greater detail, according to some embodiments.

Turning now to FIG. 6, a block diagram illustrating the interconnections between various components of system 100 is shown, according to some embodiments. As described above, system 100 may receive data from an incentive provider 114. Incentive provider 114 may provide pricing information from utilities 320, as well as the regulation signals AReg and RegA. In one embodiment, the pricing information and the regulation signals may be provided to a network 602. Network 602 may provide access to the data via an internet connection. In some examples, network 602 may encrypt the data or limit access to those with the appropriate permissions. In some embodiments, network 602 may be a local network within system 100. The pricing information may be provided to network 602 via a web service server 604. Further, the regulation signals may be provided to network 602 via a Modbus client 606. However, other communication clients can also be used. Additionally, weather data may be provided to network 602 via web service 608.

A router 610 may be in communication with network 602. In one embodiment, router 610 may be in communication with network 602 over a wired connection such as Ethernet. In other embodiments, router 610 may be in communication with network 602 via a wireless connection, such as Wi-Fi. In one embodiment, router 610 may be a Merakai router from Cisco. In some embodiments, router 610 may be a multiple gigabit router to allow for fast, large-scale data transfers from network 602 to high level controller 306. High level controller 306 may receive the data from network 602 via a communication interface 612. Communications interface 612 may include wired or wireless interfaces (e.g., jacks, antennas, transmitters, receivers, transceivers, wire terminals, etc.) for conducting data communications with various systems, devices, or networks. For example, communications interface 612 may include an Ethernet card and port for sending and receiving data via an Ethernet-based communications network and/or a Wi-Fi transceiver for communicating via a wireless communications network. Communications interface 612 may be configured to communicate via local area networks or wide area networks (e.g., the Internet, a building WAN, etc.) and may use a variety of communications protocols (e.g., BACnet, MODBUS, CAN, IP, LON, etc.).

High level controller 306 is shown to include a server 614. Within server 614, one or more virtual machines may exist. For example, server 614 may include a high level control virtual machine 616. High level control virtual machine 616 may perform the functions of high level controller 306 described above. Server 614 may further include a data collection and control machine. Data collection and control machine 618 may include a supervisory control and data acquisition (SCADA) client for acquiring data received via the network 602, as well as data received from low level controller 308. Data collection and control machine 618 may then provide the necessary data to high level control virtual machine 616 or low level controller 308, as needed. In some embodiments, server 614 includes an optional virtual machine 620 for simulating optimizations of a battery system.

High level controller 306 may further include a communication interface 622 for communicating with an internal router 624. Communications interface 622 may include wired or wireless interfaces (e.g., jacks, antennas, transmitters, receivers, transceivers, wire terminals, etc.) for conducting data communications with various systems, devices, or networks. For example, communications interface 622 may include an Ethernet card and port for sending and receiving data via an Ethernet-based communications network and/or a Wi-Fi transceiver for communicating via a wireless communications network. Communications interface 622 may be configured to communicate via local area networks or wide area networks (e.g., the Internet, a building WAN, etc.) and may use a variety of communications protocols (e.g., BACnet, MODBUS, CAN, IP, LON, etc.).

Internal router 624 may further be in communication with network 602 on the other side of a firewall 626. Firewall 626 may provide a wide area network (WAN) 628 for communication with internal router 624. Firewall 626 serves to isolate low level controller 308 from the larger network 602. This can provide additional security, such as by protecting low level controller against unauthorized access. Further, by isolating low level controller 308 from the larger network 602, low level controller 308 is further protected against vulnerabilities of the larger network 602 being exploited, which could potentially effect or damage battery system 304. However, firewall 626 can allow authorized information to be passed from network 602 to WAN 628. This can allow low level controller 308 access to data on network 602, such as pricing, or other configuration data from a user interface, such as user interface 630. Low level controller 308 is in communication with internal router 624, and thereby has access to data from network 602, as well as data from high level controller 306, such as the midpoints discussed above.

Low level controller 308 may communicate with one or more IOMs 319 and/or battery system 304 via communication link 632. In one embodiment, the communication link 632 may use a Modbus/TCP communication protocol. However, the communication link 632 may also use other communication protocols such as CAN, TCP/IP, IP, or other applicable communication protocols. This allows the low level controller 308 to quickly communicate and control the battery system, as described above.

Further, FIG. 6 shows a user interface 630. While optimization controller 112 is configured to generally be autonomous, user interface 630 may allow for installation, configuration and supervision by a user. In one embodiment, user interface 630 may act as an administrator, allowing for configuration of optimization controller 112, as well as battery system 304. In other embodiments, user interface 630 may act as an operator, allowing a user to interface with optimization controller 112 and battery system 304 in regards to general operations. General operations can include monitoring, troubleshooting, and incident response. In one embodiment, user interface 630 may be a stationary device such as a personal computer or a dedicated control interface. In other embodiments, user interface 630 may be a portable device such as a laptop computer, a tablet computer (iPad, Android Table, Microsoft Surface), a smart phone (iPhone, Windows Phone, Android Phones, etc.), or other mobile device. User interface 630 may communicate with high level controller 306 or low level controller 308 via network 602.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A frequency response optimization system comprising:
a battery configured to store and discharge electric power;
a power inverter configured to control an amount of the electric power stored or discharged from the battery at each of a plurality of time steps during a frequency response period;
a high level controller configured to:
receive a regulation signal from an incentive provider,
determine statistics of the regulation signal, and
uses the statistics of the regulation signal to generate a frequency response midpoint that maintains the battery at the same state-of-charge at a beginning and an end of the frequency response period while participating in a frequency response program;
a low level controller configured to use the midpoint to determine optimal battery power setpoints for the power inverter; and
wherein the power inverter is configured to use the optimal battery power setpoints to control the amount of the electric power stored or discharged from the battery.

2. The frequency response optimization system of claim 1, wherein the low level controller is a network automation engine controller.

3. The frequency response optimization system of claim 2, wherein the low level controller is configured to communicate with a battery management unit configured to monitor one or more parameters associated with the battery.

4. The frequency response optimization system of claim 3, wherein the parameters include at least one of a state of charge (SOC) of the battery, a depth of discharge of the battery, and a battery cell temperature.

5. The frequency response optimization system of claim 1, wherein the low level controller is configured to communicate with an input/output module in communication with one or more sub-systems associated with the battery.

6. The frequency response optimization system of claim 5, wherein the one or more sub-systems includes an environmental system configured to regulate the environment of the battery.

7. The frequency response optimization system of claim 5, wherein the one or more sub-systems includes a safety system configured to provide safety and security information related to the battery to the low level controller.

8. The frequency response optimization system of claim 1, wherein the high level controller comprises a battery power loss estimator configured to estimate an amount of power lost in the battery based on the statistics of the regulation signal.

9. The frequency response optimization system of claim 1, wherein the high level controller is configured to generate filter parameters based on the midpoint; and
the low level controller is configured to use the filter parameters to filter the regulation signal and determine the optimal battery power setpoints using the filtered regulation signal.

10. The frequency response optimization system of claim 1, wherein the high level controller is configured to generate an objective function comprising:
an estimated amount of frequency response revenue that will result from the battery power setpoints; and an estimated cost of battery degradation that will result from the battery power setpoints.

11. The frequency response optimization system of claim 10, wherein the high level controller is configured to implement constraints on the objective function, the constraints comprising at least one of:
constraining a state-of-charge of the battery between a minimum state-of-charge and a maximum state-of-charge; and
constraining the midpoint such that a sum of the midpoint and a campus power usage does not exceed a maximum power rating of the power inverter.

12. The frequency response optimization system of claim 1, wherein the high level controller is configured to use a battery life model to determine an estimated cost of battery degradation, the battery life model comprising a plurality of variables that depend on the battery power setpoints, the variables comprising at least one of:
a temperature of the battery;
a state-of-charge of the battery;
a depth of discharge of the battery;
a power ratio of the battery; and
an effort ratio of the battery.

13. A frequency response optimization system comprising:
a battery configured to store and discharge electric power;
a power inverter configured to control an amount of the electric power stored or discharged from the battery at each of a plurality of time steps during a frequency response period; and
a high level controller configured to:
receive a regulation signal from an incentive provider, determine statistics of the regulation signal, and
use the statistics of the regulation signal to generate an optimal frequency response midpoint that achieves a desired change in the state-of-charge of the battery while participating in a frequency response program;
a low level controller configured to use the midpoints to determine optimal battery power setpoints for the power inverter;
wherein the power inverter is configured to use the optimal battery power setpoints to control the amount of the electric power stored or discharged from the battery.

14. The frequency response optimization system of claim 13, wherein the high level controller comprises a battery power loss estimator configured to estimate an amount of power lost in the battery based on the statistics of the regulation signal.

15. The frequency response optimization system of claim 13, wherein the high level controller is configured to generate filter parameters based on the optimal midpoint; and
the low level controller is configured to use the filter parameters to filter the regulation signal and determines the optimal battery power setpoints using the filtered regulation signal.

16. The frequency response optimization system of claim 13, wherein the high level controller is configured to generate an objective function comprising:
an estimated amount of frequency response revenue that will result from the midpoint; and
an estimated cost of battery degradation that will result from the midpoint.

17. The frequency response optimization system of claim 16, wherein the high level controller is configured to implement constraints on the objective function, the constraints comprising at least one of:
constraining a state-of-charge of the battery between a minimum state-of-charge and a maximum state-of-charge; and
constraining the midpoint such that a sum of the midpoint and a campus power usage does not exceed a maximum power rating of the power inverter.

18. An optimization controller for a battery, the optimization controller comprising:
a high level controller configured to receive a regulation signal from an incentive provider, determine statistics of the regulation signal, and use the statistics of the regulation signal to generate a frequency response midpoint; and
a low level controller configured to use the frequency response midpoint to determine optimal battery power setpoints and use the optimal battery power setpoints to control an amount of electric power stored or discharged from the battery during a frequency response period.

19. The optimization controller of claim 18, wherein the high level controller is configured to determine the frequency response midpoint that maintains the battery at the same state-of-charge at a beginning and an end of the frequency response period while participating in a frequency response program.

20. The optimization controller of claim 18, wherein the high level controller is configured to determine an optimal frequency response midpoint that achieves a desired change in the state-of-charge of the battery while participating in a frequency response program.

* * * * *